(12) United States Patent
Kim et al.

(10) Patent No.: US 12,062,706 B2
(45) Date of Patent: Aug. 13, 2024

(54) SEMICONDUCTOR DEVICE

(71) Applicant: SAMSUNG ELECTRONICS CO., LTD., Suwon-si (KR)

(72) Inventors: Jae-Jung Kim, Suwon-si (KR); Sang Yong Kim, Suwon-si (KR); Byoung Hoon Lee, Suwon-si (KR); Chan Hyeong Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 408 days.

(21) Appl. No.: 17/503,764

(22) Filed: Oct. 18, 2021

(65) Prior Publication Data

US 2022/0254884 A1 Aug. 11, 2022

(30) Foreign Application Priority Data

Feb. 5, 2021 (KR) .................. 10-2021-0016482

(51) Int. Cl.
  *H01L 29/423* (2006.01)
  *H01L 21/8234* (2006.01)
  *H01L 21/8238* (2006.01)
  *H01L 29/06* (2006.01)

(52) U.S. Cl.
  CPC .......... *H01L 29/42392* (2013.01); *H01L 21/823431* (2013.01); *H01L 21/82345* (2013.01); *H01L 21/823821* (2013.01); *H01L 29/0673* (2013.01)

(58) Field of Classification Search
  CPC ....... H01L 21/823431; H01L 21/82345; H01L 21/823821; H01L 21/823842; H01L 27/0886; H01L 27/092; H01L 27/0924; H01L 29/0673; H01L 29/42392; H01L 29/4966; H01L 29/66045; H01L 29/66439; H01L 29/66477; H01L 29/66484; H01L 29/66795; H01L 29/775; H01L 29/78696; B82Y 10/00
  See application file for complete search history.

(56) References Cited

U.S. PATENT DOCUMENTS

| | | | |
|---|---|---|---|
| 9,825,183 B2 | 11/2017 | Lee et al. | |
| 9,899,416 B2 | 2/2018 | Kim et al. | |
| 10,475,898 B2 | 11/2019 | Chung et al. | |
| 10,497,626 B2 | 12/2019 | Chen et al. | |
| 10,522,344 B2 | 12/2019 | Cheng et al. | |
| 10,600,913 B2 | 3/2020 | Chung et al. | |
| 10,720,431 B1 | 7/2020 | Cheng et al. | |
| 2019/0259839 A1* | 8/2019 | Ryu | H01L 29/66734 |

* cited by examiner

*Primary Examiner* — Cheung Lee
(74) *Attorney, Agent, or Firm* — F. CHAU & ASSOCIATES, LLC

(57) ABSTRACT

A semiconductor device includes an active pattern disposed on a substrate. A gate insulating film is disposed on the active pattern and extends along the active pattern. A work function adjustment pattern is disposed on the gate insulating film and extends along the gate insulating film. A gate electrode is disposed on the work function adjustment pattern. The work function adjustment pattern includes a first work function adjustment film, a second work function adjustment film that includes aluminum and wraps the first work function adjustment film, and a barrier film including titanium silicon nitride (TiSiN). A silicon concentration of the barrier film is in a range of about 30 at % or less.

20 Claims, 23 Drawing Sheets

SEMICONDUCTOR DEVICE

CROSS-REFERENCE TO RELATED APPLICATION

This application claims priority under 35 U.S.C. § 119 to Korean Patent Application No. 10-2021-0016482, filed on Feb. 5, 2021 in the Korean Intellectual Property Office, the disclosure of which is incorporated by reference in its entirety herein.

1. TECHNICAL FIELD

The present inventive concept relates to a semiconductor device.

2. DISCUSSION OF RELATED ART

A gate-all-around structure in which a nanowire-shaped silicon body is formed on a substrate and a gate is formed to surround the silicon body has been developed as a scaling technique for increasing a density of semiconductor devices.

Since such a gate-all-around structure utilizes three-dimensional channels, scaling is easily performed, and the current control capability may be increased even if a gate length is not increased. Furthermore, it is possible to effectively suppress a SCE (short channel effect) in which potential of a channel region is influenced by a drain voltage.

SUMMARY

According to an embodiment of the present inventive concept, a semiconductor device includes an active pattern disposed on a substrate. A gate insulating film is disposed on the active pattern and extends along the active pattern. A work function adjustment pattern is disposed on the gate insulating film and extends along the gate insulating film. A gate electrode is disposed on the work function adjustment pattern. The work function adjustment pattern includes a first work function adjustment film, a second work function adjustment film that includes aluminum and wraps the first work function adjustment film, and a barrier film including titanium silicon nitride (TiSiN). A silicon concentration of the barrier film is in a range of about 30 at % or less.

According to an embodiment of the present inventive concept, a semiconductor device includes a substrate including a first region and a second region. A first active pattern is disposed on the first region of the substrate. A first gate insulating film is disposed on the first active pattern and extends along the first active pattern. A first work function adjustment pattern is disposed on the first gate insulating film and extends along the first gate insulating film. A first gate electrode is disposed on the first work function adjustment pattern. A second active pattern is disposed on the second region of the substrate. A second gate insulating film is disposed on the second active pattern and extends along the second active pattern. A second work function adjustment pattern is disposed on the second gate insulating film and extends along the second gate insulating film. A second gate electrode is disposed on the second work function adjustment pattern. The first work function adjustment pattern includes a first barrier film including titanium silicon nitride (TiSiN), and a first work function adjustment film that includes aluminum and wraps the first barrier film. The second work function adjustment pattern includes a second work function adjustment film including aluminum, and a second barrier film which includes titanium silicon nitride (TiSiN) and wraps the second work function adjustment film.

According to an embodiment of the present inventive concept, a semiconductor device includes a substrate including a first region and a second region. A first active pattern is disposed on the first region of the substrate. The first active pattern includes a first lower pattern protruding from the substrate in a thickness direction of the substrate, and a plurality of first sheet patterns disposed on the first lower pattern and spaced apart from the first lower pattern in the thickness direction of the substrate. A first gate insulating film is disposed on the first active pattern and extends along the first active pattern. A first work function adjustment pattern is disposed on the first gate insulating film and extends along the first gate insulating film. A first gate electrode is disposed on the first work function adjustment pattern. A second active pattern is disposed on the second region of the substrate. The second active pattern includes a second lower pattern protruding from the substrate in the thickness direction of the substrate, and a plurality of second sheet patterns disposed on the second lower pattern and spaced apart from the second lower pattern in the thickness direction of the substrate. A second gate insulating film is disposed on the second active pattern and extends along the second active pattern. A second work function adjustment pattern is disposed on the second gate insulating film and extends along the second gate insulating film. A second gate electrode is disposed on the second work function adjustment pattern. The first work function adjustment pattern includes a first work function adjustment film, a second work function adjustment film that includes aluminum and wraps the first work function adjustment film, and a first barrier film including titanium silicon nitride (TiSiN). The second work function adjustment pattern includes a third work function adjustment film, a fourth work function adjustment film that includes aluminum and wraps the third work function adjustment film, and a second barrier film including titanium silicon nitride (TiSiN). A thickness of the second work function adjustment film is greater than a thickness of the first work function adjustment film and a thickness of the first barrier film. A thickness of the fourth work function adjustment film is greater than a thickness of the third work function adjustment film and a thickness of the second barrier film.

Aspects of the present inventive concept provide a semiconductor device in which operating characteristics of a transistor are increased.

However, aspects of the present inventive concept are not restricted to the one set forth herein. The above and other aspects of the present inventive concept will become more apparent to one of ordinary skill in the art to which the present inventive concept pertains by referencing the detailed description of embodiments given below.

BRIEF DESCRIPTION OF THE DRAWINGS

The above and other aspects and features of the present inventive concept will become more apparent by describing in detail embodiments thereof with reference to the attached drawings, in which.

DETAILED DESCRIPTION OF EMBODIMENTS

Figure 1:
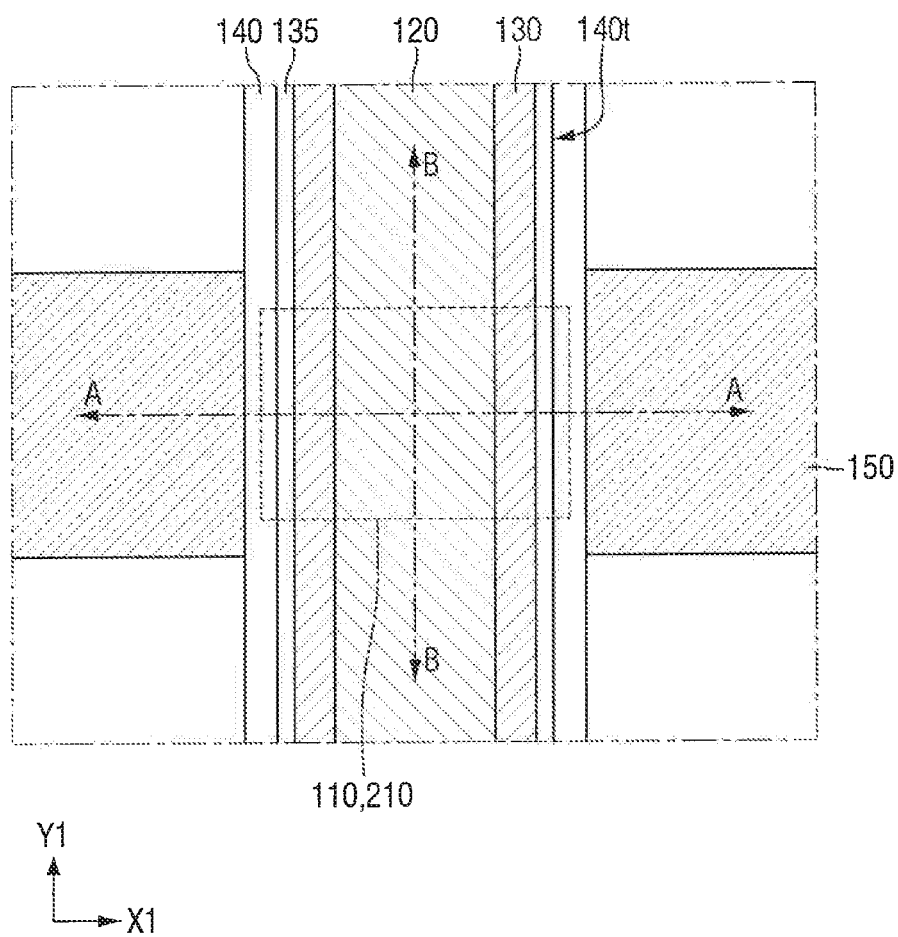
FIG. 1 is a plan view of a semiconductor device according to an embodiment of the present inventive concept.

In the drawings of semiconductor devices according to some embodiments, as an example, although a gate-all-around transistor (GAA FET) including nanowire or nanosheet, MBCFET™ (Multi-Bridge Channel Field Effect Transistor), and a fin-type transistor (FinFET) including a channel region of a fin-type pattern shape are shown, the present inventive concept is not limited thereto. The semiconductor device according to some embodiments may, of course, include a tunneling FET or a three-dimensional (3D) transistor. The semiconductor device according to some embodiments may, of course, include a planar transistor. The technical idea of the present inventive concept may be applied to a transistor based on a two-dimensional material (2D material based FETs) and heterostructures thereof. Further, the semiconductor device according to some embodiments may also include a bipolar junction transistor, a laterally diffused metal oxide semiconductor (LDMOS), and the like.

Figure 2:
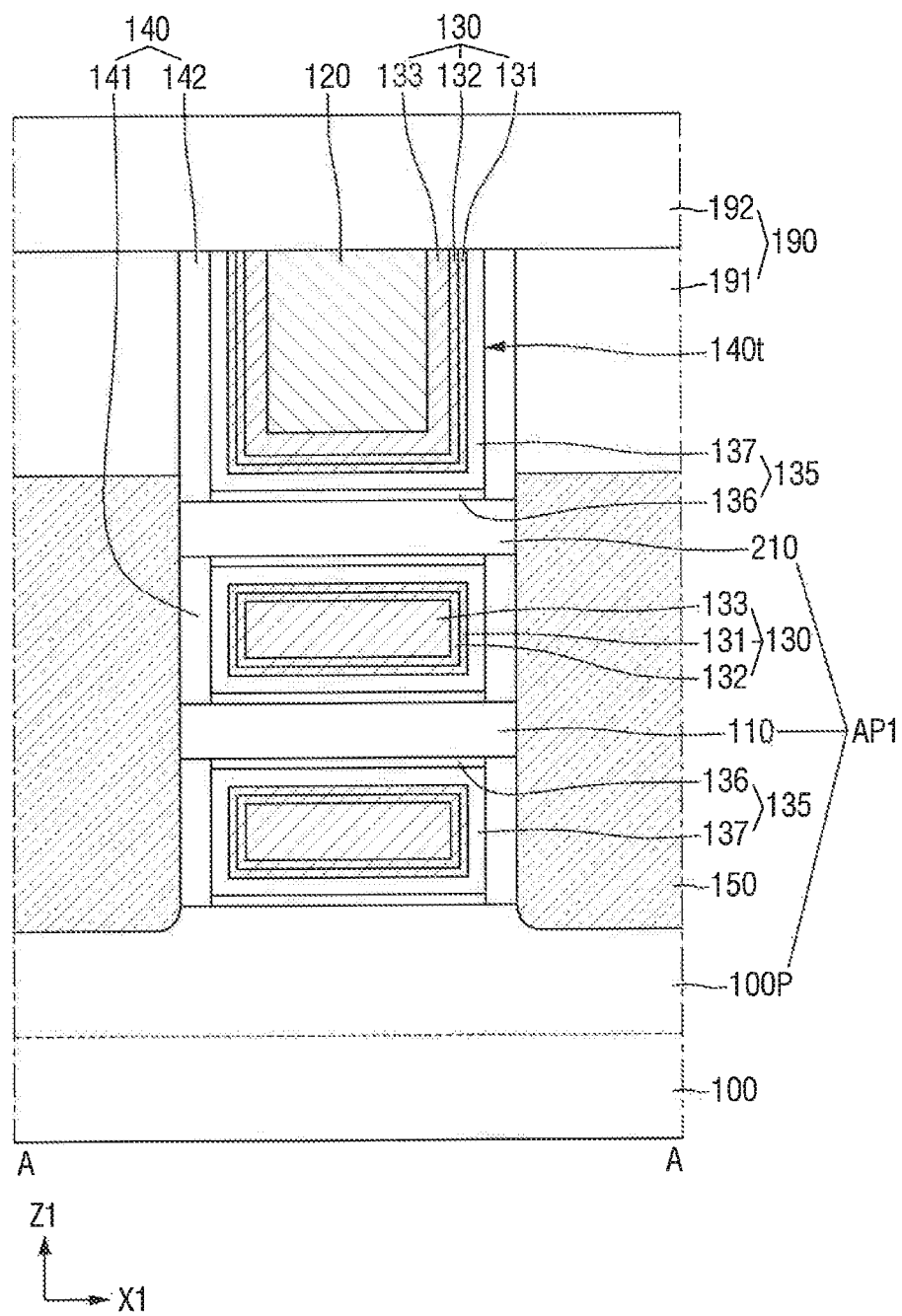
FIG. 2 is a cross-sectional view taken along A-A of FIG. 1 according to an embodiment of the present inventive concept.
Figure 3:
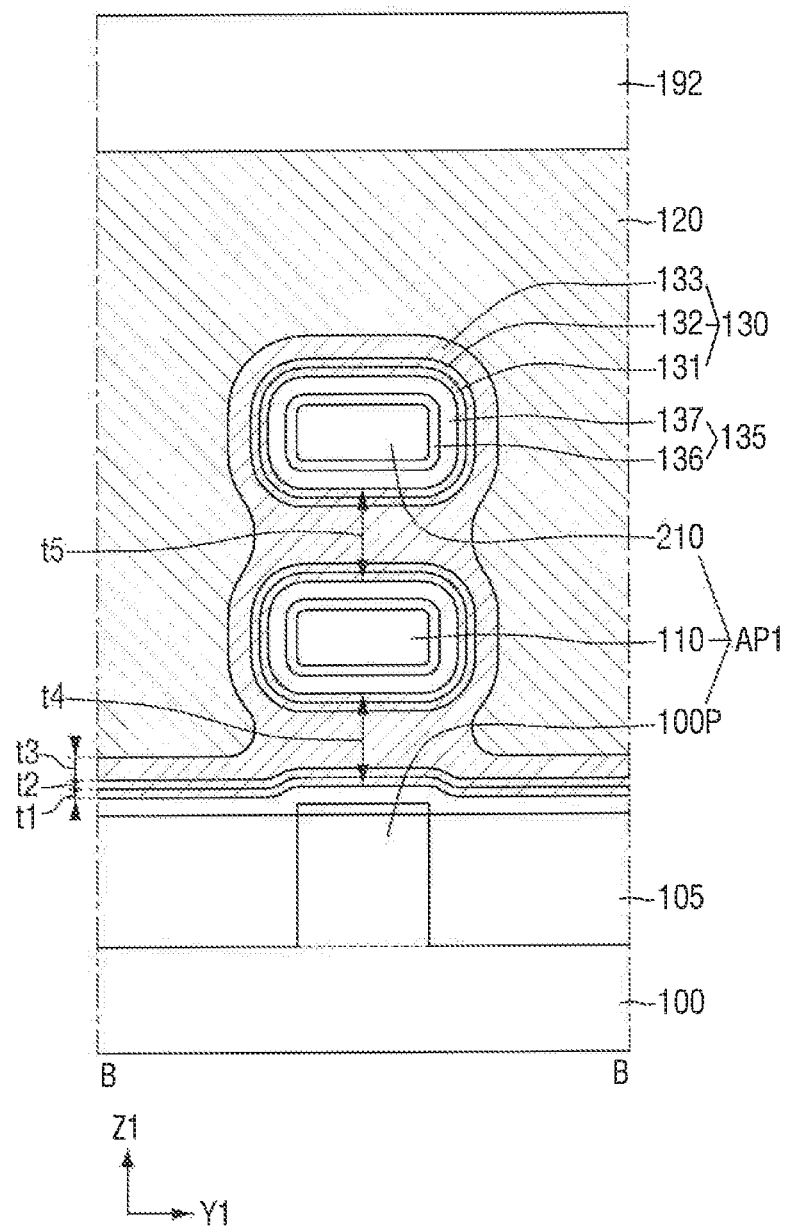
FIG. 3 is a cross-sectional view taken along B-B of FIG. 1 according to an embodiment of the present inventive concept.

FIG. 1 is a plan view for explaining a semiconductor device according to some embodiments. FIG. 2 is a cross-sectional view taken along A-A of FIG. 1. FIG. 3 is a cross-sectional view taken along B-B of FIG. 1.

Referring to FIGS. 1 to 3, the semiconductor device according to some embodiments may include a substrate 100, a first active pattern AP1, a first gate electrode 120, a first work function adjustment pattern 130, a first gate insulating film 135, and a first gate spacer 140.

In an embodiment, the substrate 100 may be bulk silicon or an SOI (silicon-on-insulator). However, embodiments of the present inventive concept are not limited thereto. For example, in some embodiments, the substrate 100 may be a silicon substrate, or may include other materials, such as silicon germanium, SGOI (silicon germanium on insulator), indium antimonide, lead tellurium compounds, indium arsenic, indium phosphide, gallium arsenide or gallium antimonide.

A first active pattern AP1 may be disposed on the substrate 100. The first active pattern AP1 may extend longitudinally in a first direction X1. In an embodiment, the first active pattern AP1 may include a first lower pattern 100P and a plurality of first sheet patterns 110 and 210. In an embodiment, the first active pattern AP1 may include, for example, a PMOS channel region. However, embodiments of the present inventive concept are not limited thereto.

The first lower pattern 100P may protrude from the substrate 100. For example, in an embodiment, the first lower pattern 100P may protrude from the substrate 100 in a third direction Z1 which is perpendicular to the X1 direction and is a thickness direction of the substrate 100. The first lower pattern 100P may extend longitudinally in the first direction X1.

A plurality of first sheet patterns 110 and 210 may be disposed on the first lower pattern 100P. The plurality of first sheet patterns 110 and 210 may be spaced apart from the first lower pattern 100P in the third direction Z1. The first sheet pattern 110 disposed at the lowermost part of the plurality of first sheet patterns 110 and 210 may be spaced apart from the first lower pattern 100P in the third direction Z1. The plurality of first sheet patterns 110 and 210 may be spaced apart from each other in the third direction Z1.

The plurality of first sheet patterns 110 and 210 may overlap the first lower pattern 100P in the third direction Z1. The plurality of first sheet patterns 110 and 210 are not formed on the field insulating film 105, but may be formed on the first lower pattern 100P.

Although the first active pattern AP1 is shown to include two first sheet patterns 110 and 210, this is merely for convenience of explanation, and embodiments of the present inventive concept are not limited thereto. For example, the number of the first sheet patterns may be three or more in some embodiments.

In an embodiment, the first lower pattern 100P may be formed by etching a portion of the substrate 100, and may include an epitaxial layer that is grown from the substrate 100. The first lower pattern 100P may include silicon or germanium, which is an elemental semiconductor material. Further, the first lower pattern 100P may include a compound semiconductor, and may include, for example, a group IV-IV compound semiconductor or a group III-V compound semiconductor. However, embodiments of the present inventive concept are not limited thereto.

The group IV-IV compound semiconductor may be, for example, a binary compound or a ternary compound including at least two or more compounds selected from carbon (C), silicon (Si), germanium (Ge), and tin (Sn), or a compound obtained by doping these elements with a group IV element. The group III-V compound semiconductor may be, for example, one of a binary compound, a ternary compound or a quaternary compound formed by combining at least one compound selected from aluminum (Al), gallium (Ga) and indium (In) as a group III element with one of phosphorus (P), arsenic (As) and antimony (Sb) as a group V element.

In an embodiment, each of first sheet patterns 110 and 210 may include one of silicon or germanium, which is an elemental semiconductor material, the group IV-IV compound semiconductor or the group III-V compound semiconductor. In an embodiment, each of the first sheet patterns 110 and 210 may be used as a channel region of the transistor. Each of the first sheet patterns 110 and 210 may include the same material or different materials. In addition, each of the first sheet patterns 110 and 210 may include the same material as that of the first lower pattern 100P, or may include a material different from the first lower pattern 100P.

In the semiconductor device according to some embodiments, the first lower pattern 100P may be a silicon lower pattern including silicon, and the plurality of first sheet patterns 110 and 210 may be a silicon sheet pattern including silicon.

A width of the each of the first sheet patterns 110 and 210 in a second direction Y1 that is perpendicular to both the first direction X1 and the third direction Z1 may be increased or decreased in proportion to a width of the first lower pattern 100P in the second direction Y1. While the first to third directions X1, Y1, Z1 are shown as being perpendicular to each other, embodiments of the present inventive concept are not limited thereto and the first to third directions X1, Y1, Z1 may intersect each other at various different angles. As an example, although the width in the second direction Y1 of the first sheet patterns 110 and 210 stacked in the third direction Z1 is shown as being the same in FIG. 3, this is merely for convenience of explanation, and embodiments of the present inventive concept are not limited thereto. For example, in an embodiment, as the distances of the first sheet patterns 110 and 210 from the first lower pattern 100P increases, the widths in the second direction Y1 of the first sheet patterns 110 and 210 stacked in the third direction Z1 may decrease.

A field insulating film 105 may be disposed on the substrate 100. The field insulating film 105 may wrap at least a portion of the side walls of the first lower pattern 100. For example, a portion of the first lower pattern 100P may protrude in the third direction Z1 from the upper surface of the field insulating film 105. Each of the first sheet patterns 110 and 210 may be disposed at a position that is higher than the upper surface of the field insulating film 105. However, embodiments of the present inventive concept are not limited thereto. For example, in an embodiment, the field insulating film 105 may entirely cover the side walls of the first lower pattern 100P.

In an embodiment, the field insulating film 105 may include, for example, an oxide film, a nitride film, an oxynitride film, or a combination film thereof. Although the field insulating film 105 is shown as a single film, this is merely for convenience of explanation, and embodiment of the present inventive concept are not limited thereto. For example, in some embodiments, the field insulating film 105 may include wo or more films.

The first gate spacer 140 may extend longitudinally in the second direction Y1. The first gate spacer 140 may intersect the respective first sheet patterns 110 and 210. The first gate spacer 140 may define a first gate trench 140t that intersects each of the first sheet patterns 110 and 210.

The first gate spacer 140 may be disposed at both ends of each of the first sheet patterns 110 and 210 extending in the first direction X1. The first gate spacers 140 may be formed to face each other on both sides of each of the first sheet patterns 110 and 210. The first gate spacer 140 may include a penetration portion through which each of the first sheet patterns 110 and 210 passes. Each of the first sheet patterns 110 and 210 may pass through the first gate spacer 140. In an embodiment, the first gate spacer 140 may be in direct contact with an entirety of the periphery of the ends of each of the first sheet patterns 110 and 210.

The first gate spacer 140 may include a first inner spacer 141 and a first outer spacer 142. The first inner spacer 141 may be disposed between the first lower pattern 100P and the first sheet pattern 110 adjacent to each other in the third direction Z1, and between the first sheet patterns 110 and 210 adjacent to each other in the third direction Z1.

The first inner spacer 141 may be formed at a position that vertically overlaps the first sheet patterns 110 and 210 (e.g., overlaps the first sheet patterns 110 and 210 in the third direction Z1). In an embodiment, the first inner spacer 141 may not be formed on the field insulating film 105 that does not overlap the first sheet patterns 110 and 210. For example, the first outer spacer 142 may be formed on the upper surface of the field insulating film 105. The first outer spacer 142 may be disposed on the first sheet pattern 210.

The first inner spacer 141 may include, for example, at least one compound selected from silicon nitride (SiN), silicon oxynitride (SiON), silicon oxide ($SiO_2$), silicon oxycarbonitride (SiOCN), and combinations thereof. The first outer spacer 142 may include, for example, at least one compound selected from silicon nitride (SiN), silicon oxynitride (SiON), silicon oxide ($SiO_2$), silicon oxycarbonitride (SiOCN), and combinations thereof. The first inner spacer 141 and the first outer spacer 142 may be the same material or different materials.

The first gate insulating film 135, the first work function adjustment pattern 130, and the first gate electrode 120 may be disposed on the substrate 100. The first gate insulating film 135, the first work function adjustment pattern 130, and the first gate electrode 120 may be positioned between the first gate spacers 140 (e.g., in the first direction X1). The first gate insulating film 135, the first work function adjustment pattern 130, and the first gate electrode 120 may fill the first gate trench 140t and extend longitudinally in the second direction Y1.

The first gate insulating film 135 may be disposed on the first active pattern AP1. The first gate insulating film 135 may extend along the upper surface of the field insulating film 105 and the upper surface of the first lower pattern 100P. The first gate insulating film 135 may be disposed along the periphery of each of the first sheet patterns 110 and 210. The first gate insulating film 135 may wrap each of the first sheet patterns 110 and 210.

The first gate insulating film 135 may include a first interfacial layer 136, and a first high-dielectric constant insulating film 137. The first interfacial layer 136 may be disposed between the respective first sheet patterns 110 and 210 and the first high-dielectric constant insulating film 137. The first interfacial layer 136 may be disposed along the upper surface of the first lower pattern 100P and the respective first sheet patterns 110 and 210.

Although the drawing shows that the first interfacial layer 136 is not formed along the inner side wall of the first gate spacer 140 and the upper surface of the field insulating film 105, embodiments of the present inventive concept are not limited thereto. For example, in some embodiments, the first interfacial layer 136 may also be disposed along the side wall of the first gate spacer 140 and the upper surface of the field insulating film 105.

The first high-dielectric constant insulating film 137 may be disposed on the first interfacial layer 136 (e.g., directly thereon). The first interfacial layer 136 may be disposed between the first high-dielectric constant insulating film 137 and the first active pattern AP1. The first high-dielectric constant insulating film 137 may also be disposed on the upper surface of the field insulating film 105 and the first lower pattern 100P. The first high-dielectric constant insulating film 137 may extend along the inner side wall of the first gate spacer 140. The first high-dielectric constant insulating film 137 may extend along the side walls and the bottom surface of the first gate trench 140t, and the periphery of each of the first sheet patterns 110 and 210. In an embodiment in which each of the first sheet patterns 110 and 210 includes silicon, the first interfacial layer 136 may include silicon oxide ($SiO_2$). However, embodiments of the present inventive concept are not limited thereto. For example, the materials included in the first interfacial layer 136 may differ depending on the materials included in each of the first sheet patterns 110 and 210.

The first high-dielectric constant insulating film 137 may include a high-dielectric constant material having a higher dielectric constant than silicon nitride. The first high-dielectric constant insulating film 137 may include an insulating material including a metal. For example, in an embodiment, the high-dielectric constant material may include at least one compound selected from hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first work function adjustment pattern 130 may be disposed on the first active pattern AP1. The first work function adjustment pattern 130 may be disposed on the first high-dielectric constant insulating film 137 and may extend along the first gate insulating film 135. The first work function adjustment pattern 130 may be disposed along the periphery of each of the first sheet patterns 110 and 210. The first work function adjustment pattern 130 may wrap each of the first sheet patterns 110 and 210. The first work function adjustment pattern 130 may be in direct contact with the first high-dielectric constant insulating film 137.

The first work function adjustment pattern 130 may include a first barrier film 131, a first work function adjustment film 132, and a second work function adjustment film 133.

The first barrier film 131 may be disposed on the first high-dielectric constant insulating film 137. The first barrier film 131 may be in direct contact with the first high-dielectric constant insulating film 137. The first barrier film 131 may be conformally formed along the first high-dielectric constant insulating film 137. The first barrier film 131 may have a first thickness t1 on the substrate 100.

In the semiconductor device according to some embodiments, the first barrier film 131 may include titanium silicon nitride (TiSiN). In an embodiment, a silicon concentration of the first barrier film 131 may be in a range of about 0 at % to about 30 at %.

The first work function adjustment film 132 may be disposed on the first barrier film 131 (e.g., directly thereon). For example, the first work function adjustment film 132 may wrap the first barrier film 131. The first work function adjustment film 132 may be in direct contact with the first barrier film 131. The first work function adjustment film 132 may be conformally formed along the first barrier film 131.

The first work function adjustment film 132 may have a second thickness t2 on the substrate 100. The second thickness t2 may be different from or the same as the first thickness t1.

In an embodiment, the first work function adjustment film 132 may be, for example, a p-type work function film that adjusts the work function. For example, the first work function adjustment film 132 may include at least one compound selected from TiN, TaC, TaN, TiSiN, TaSiN and TaCN. However, embodiments of the present inventive concept are not limited thereto. In the semiconductor device according to some embodiments, the first work function adjustment film 132 may include titanium nitride (TiN).

The second work function adjustment film 133 may be disposed on the first work function adjustment film 132. The second work function adjustment film 133 may wrap the first work function adjustment film 132. The second work function adjustment film 133 may be in direct contact with the first work function adjustment film 132. For example, the first barrier film 131 may be disposed between the first high-dielectric constant insulating film 137 and the first work function adjustment film 132, and the first work function adjustment film 132 may be disposed between the first barrier film 131 and the second work function adjustment film 133.

The second work function adjustment film 133 may be conformally formed along the first work function adjustment film 132. The second work function adjustment film 133 may have a third thickness t3 on the substrate 100. The third thickness t3 may differ from the first thickness t1 and the second thickness t2. For example, in an embodiment, the third thickness t3 may be greater than the first thickness t1 and the second thickness t2.

In an embodiment, the second work function adjustment film 133 may be, for example, an n-type work function film that adjusts the work function. The second work function adjustment film 133 may include, for example, aluminum. In an embodiment, the second work function adjustment film 133 may include at least one compound selected from TiAl, TiAlN, TiAlC, TaAl, TaAlC, TaAlN, and TaAlCN. In the semiconductor device according to some embodiments, the second work function adjustment film 133 may include titanium aluminide carbide (TiAlC).

In the third direction Z1, a first distance t4 between the first high-dielectric constant insulating films 137 facing each other between the first lower pattern 100P and the first sheet pattern 110 may be substantially the same as or different from a second distance t5 between the first high-dielectric constant insulating films 137 facing each other between the first sheet pattern 110 and the first sheet pattern 210. For example, in an embodiment, the first distance t4 and the second distance t5 may be in a range of about 10 nm or less.

In the semiconductor device according to some embodiments, the first active pattern AP1 may include a PMOS channel region, and the first barrier film 131 may be in direct contact with the first high-dielectric constant insulating film 137 of the first gate insulating film 135. In an embodiment, the first barrier film 131 may prevent the metal material contained in the second work function adjustment film 133 from being diffused into the first gate insulating film 135. For example, the first barrier film 131 may prevent the diffusion of aluminum included in the second work function adjustment film 133. A threshold voltage of the semiconductor device may be adjusted accordingly. Further, even if the first barrier film 131 has a thin thickness, the diffusion of aluminum included in the second work function adjustment film 133 may be further prevented, as compared with that of the first work function adjustment film 132. Therefore, in the semiconductor device according to some embodiments, even if the thickness of the first work function adjustment film 132 is low, the threshold voltage of the semiconductor device may be adjusted. Further, even if the spaced distance between the respective first sheet patterns 110 and 210 is relatively small, the threshold voltage of the semiconductor device may be adjusted.

The first gate electrode 120 may be disposed on the first work function adjustment pattern 130. The first gate electrode 120 may be disposed directly on the second work function adjustment film 133. The first gate electrode 120 may be disposed on the first active pattern AP1.

In an embodiment, the first gate electrode 120 may include at least one material selected from a metal, a metal alloy, a conductive metal nitride, a metal silicide, a doped semiconductor material, a conductive metal oxide and a conductive metal oxynitride. The first gate electrode 120 may include, but is not limited to, for example, at least one compound selected from titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Conductive metal oxide and conductive metal oxynitride may include, but are not limited to, oxidized forms of the aforementioned materials.

A first source/drain pattern 150 may be disposed on at least one side of the first gate electrode 120. The first source/drain pattern 150 may be disposed on the first active pattern AP1. The first source/drain pattern 150 may be in direct contact with the respective first sheet patterns 110 and 210 used as the channel region. The first source/drain pattern 150 may be connected to the respective first sheet patterns 110 and 210. The first source/drain pattern 150 may be spaced apart from the first gate insulating film 135 by the first gate spacer 140. In an embodiment, the first source/drain pattern 150 may be an epitaxial pattern formed through an epitaxial growth process. However, embodiments of the present inventive concept are not limited thereto.

An interlayer insulating film 190 may be disposed on the first source/drain pattern 150. The interlayer insulating film 190 may wrap the side walls of the first gate spacer 140. The interlayer insulating film 190 may include a lower interlayer insulating film 191 and an upper interlayer insulating film 192.

The upper interlayer insulating film 192 may be disposed on the upper surface of the first gate spacer 140, the upper surface of the first gate electrode 120, and the upper surface of the first work function adjustment pattern 130. In an embodiment, the lower interlayer insulating film 191 and the upper interlayer insulating film 192 may each include, for example, at least one compound selected from silicon oxide, silicon nitride, and silicon oxynitride. However, embodiments of the present inventive concept are not limited thereto.

Figure 4:
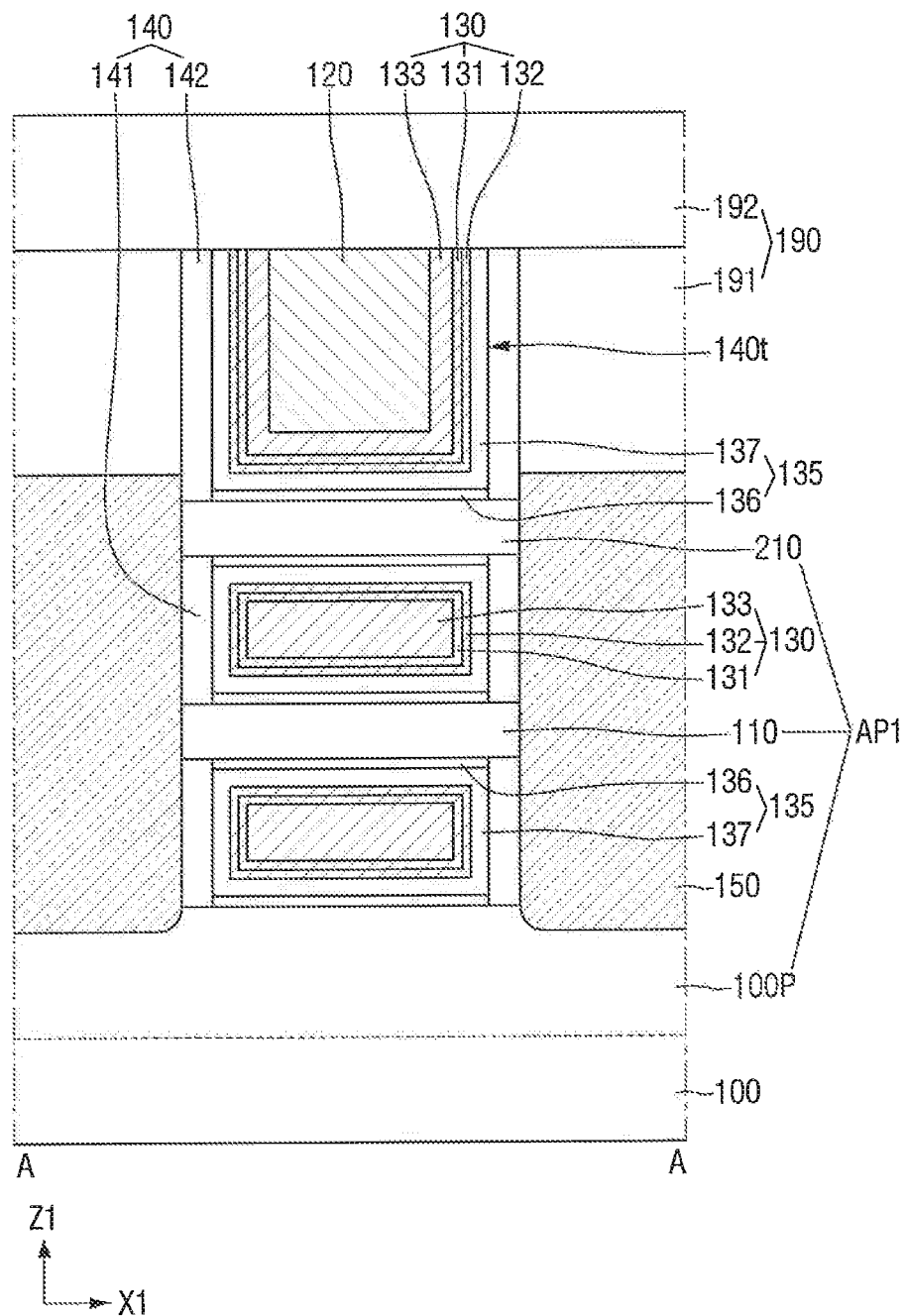
FIGS. 4 and 5 are cross-sectional views taken along line A-A of FIG. 1 and line B-B of FIG. 1, respectively, of a semiconductor device according to some embodiments of the present inventive concept.
Figure 5:
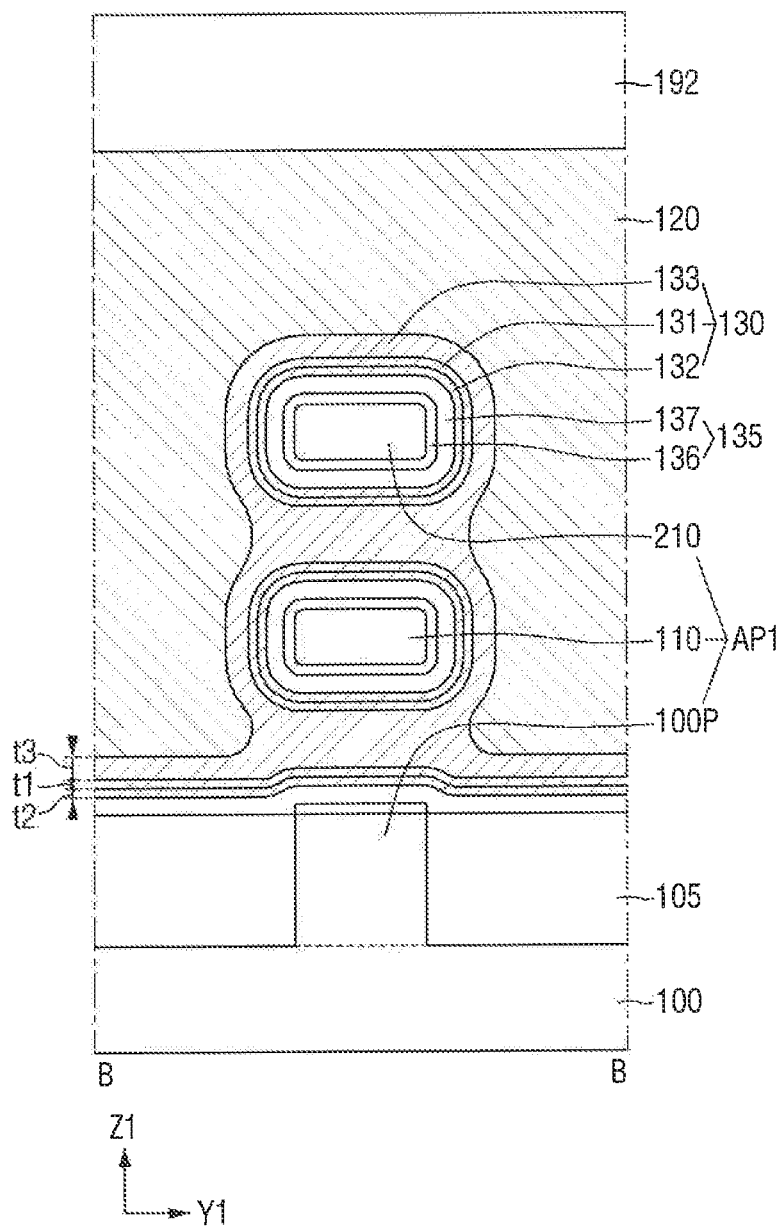

FIGS. 4 and 5 are diagrams for explaining a semiconductor device according to some embodiments. For reference, FIG. 4 is a cross-sectional view taken along A-A of FIG. 1. FIG. 5 is a cross-sectional view taken along B-B of FIG. 1. For convenience of explanation, elements different from those explained using FIGS. 1 to 3 will be mainly explained and a repeated description of similar or identical elements may be omitted.

Referring to FIGS. 4 and 5, in the semiconductor device according to some embodiments, the first barrier film 131 may be disposed between the first work function adjustment film 132 and the second work function adjustment film 133. The first barrier film 131 may wrap the first work function adjustment film 132. The first barrier film 131 may be in direct contact with the first work function adjustment film 132 and the second work function adjustment film 133.

The first work function adjustment film 132 may wrap the first high-dielectric constant insulating film 137. The first work function adjustment film 132 may be disposed directly on the first gate insulating film 135 and may be in direct contact with the first high-dielectric constant insulating film 137. For example, the first work function adjustment film 132 may be disposed between the first high-dielectric constant insulating film 137 and the first barrier film 131, and the first barrier film 131 may be disposed between the first work function adjustment film 132 and the second work function adjustment film 133.

Figure 6:
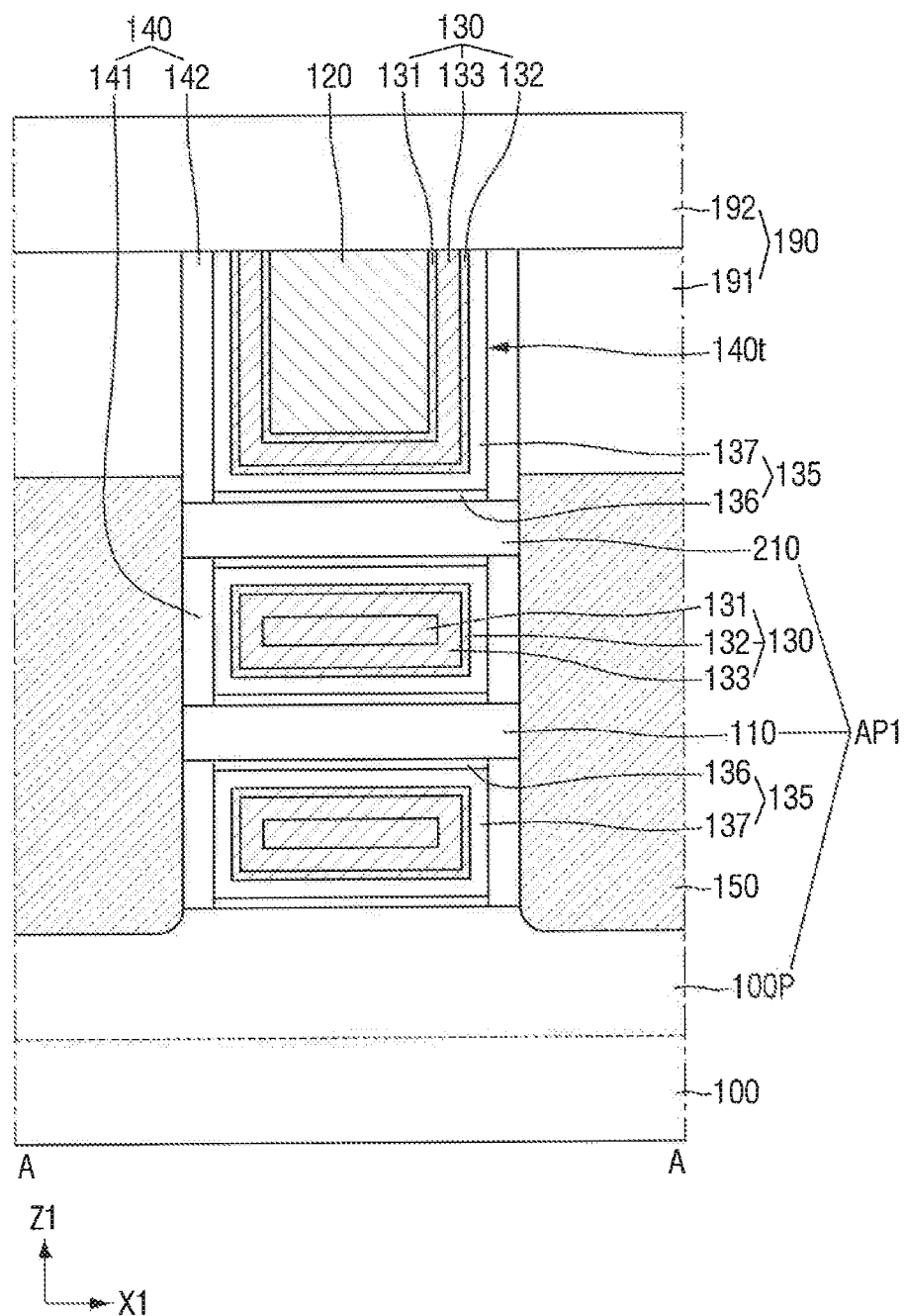
FIGS. 6 and 7 are cross-sectional views taken along line A-A of FIG. 1 and line B-B of FIG. 1, respectively, of a semiconductor device according to some embodiments of the present inventive concept.
Figure 7:
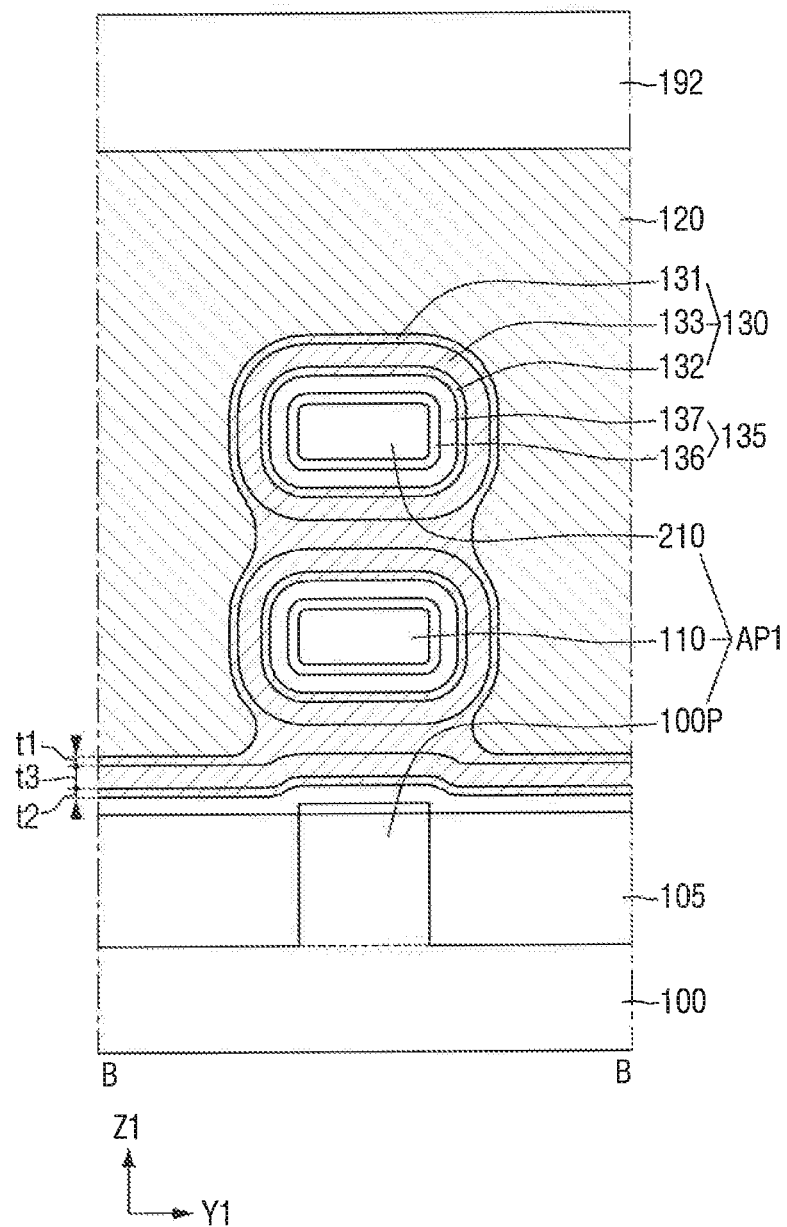

FIGS. 6 and 7 are diagrams for explaining a semiconductor device according to some embodiments. For reference, FIG. 6 is a cross-sectional view taken along A-A of FIG. 1. FIG. 7 is a cross-sectional view taken along B-B of FIG. 1. For convenience of explanation, elements different from those explained using FIGS. 1 to 3 will be mainly explained and a repeated description of similar or identical elements may be omitted.

Referring to FIGS. 6 and 7, in the semiconductor device according to some embodiments, the first barrier film 131 may wrap the second work function adjustment film 133. The first barrier film 131 may be in direct contact with the second work function adjustment film 133.

The first work function adjustment film 132 may be disposed directly on the first gate insulating film 135 and may wrap the first high-dielectric constant insulating film 137. The first work function adjustment film 132 may be in direct contact with the first high-dielectric constant insulating film 137. For example, the first work function adjustment film 132 may be disposed between the first high-dielectric constant insulating film 137 and the second work function adjustment film 133, and the second work function adjustment film 133 may be disposed between the first work function adjustment film 132 and the first barrier film 131.

In the semiconductor device according to some embodiments, the first active pattern AP1 may include an NMOS channel region, and the first barrier film 131 may wrap the second work function adjustment film 133. In an embodiment, the first barrier film 131 may prevent the metal material contained in the first gate electrode 120 formed on the second work function adjustment film 133 from being diffused into the first gate insulating film 135. The threshold voltage of the semiconductor device may be adjusted accordingly.

Figure 8:
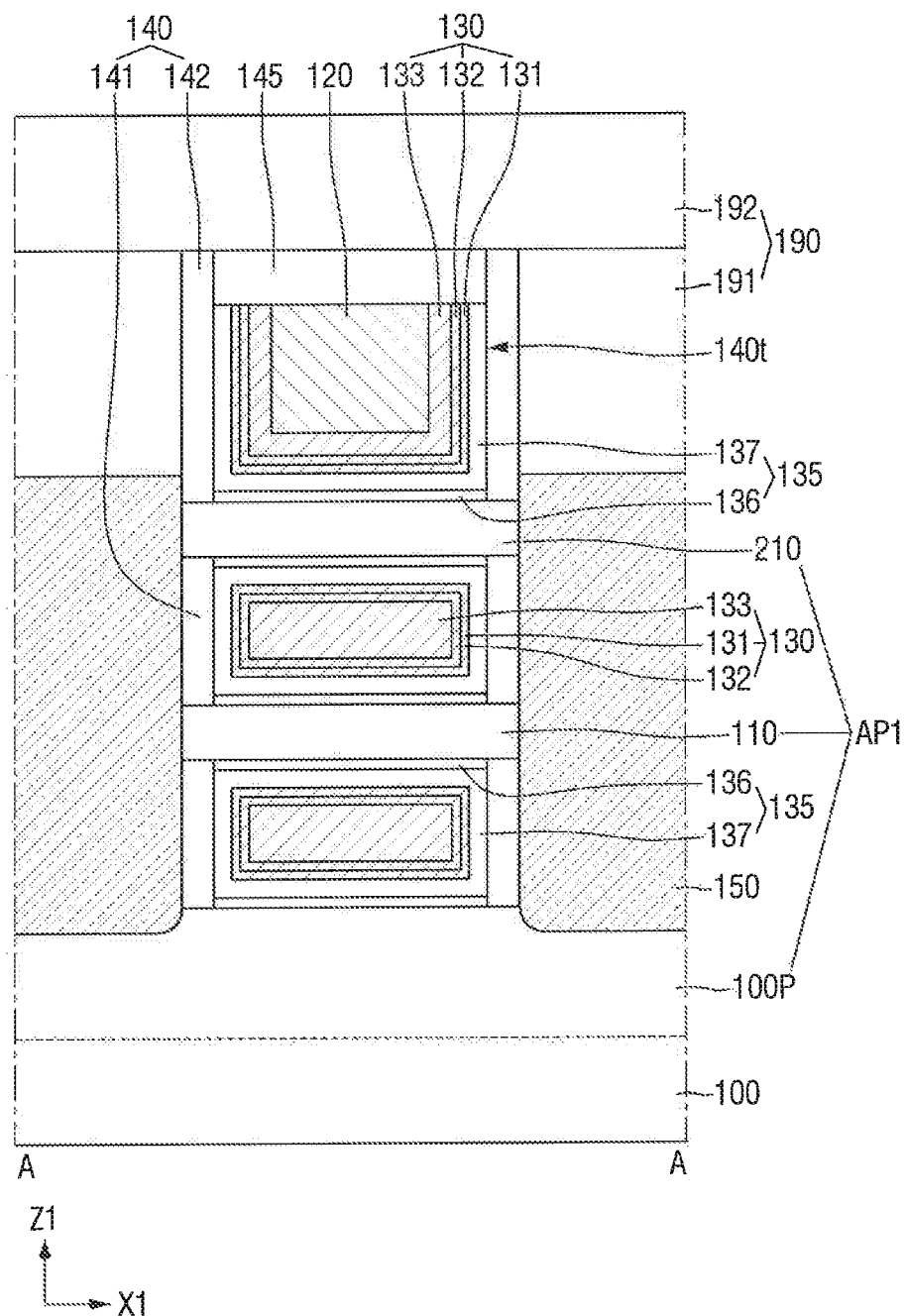
FIG. 8 is a semiconductor device taken along line A-A of FIG. 1 according to an embodiment of the present inventive concept.

FIG. 8 is a diagram for explaining the semiconductor device according to some embodiments. For reference, FIG. 8 is a cross-sectional view taken along A-A of FIG. 1. For convenience of explanation, elements different from those explained using FIGS. 1 to 3 will be mainly explained and a repeated description of similar or identical elements may be omitted.

Referring to FIG. 8, the semiconductor device according to some embodiments may further include a capping pattern 145.

The first gate electrode 120, the first work function adjustment pattern 130 and the first high-dielectric constant insulating film 137 may fill at least a portion of the first gate trench 140t. The capping pattern 145 may fill a remaining portion of the first gate trench 140t that remains after the first gate electrode 120, the first work function adjustment pattern 130, and the first gate insulating film 135 are disposed therein.

Although the drawing shows that the first high-dielectric constant insulating film 137 and the first work function adjustment pattern 130 are not disposed between the first gate spacer 140 and the capping pattern 145, this is merely for convenience of explanation, and embodiments of the present inventive concept are not limited thereto. Further, although the capping pattern 145 is shown as being disposed between the inner side walls of the first gate spacer 140, embodiments of the present inventive concept are not limited thereto. In an embodiment, an upper surface of the first gate spacer 140 may be recessed downward from the upper surface of the lower interlayer insulating film 191, like the first gate electrode 120. In this embodiment, the capping pattern 145 may be disposed on the upper surface of the first gate spacer 140 and the upper surface of the first gate electrode 120.

In an embodiment, the upper surface of the capping pattern 145 may be disposed on the same plane as the upper surface of the lower interlayer insulating film 191. The capping pattern 145 may include, for example, a material having an etching selectivity to the lower interlayer insulating film 191. For example, in an embodiment, the capping pattern 145 may include at least one compound selected from silicon nitride (SiN), silicon oxynitride (SiON), silicon oxide ($SiO_2$), silicon carbonitride (SiCN), silicon oxycarbonitride (SiOCN), and combinations thereof.

In an embodiment, the first work function adjustment pattern 130 shown in FIGS. 4 to 7 may be applied to the first work function adjustment pattern 130 shown in FIG. 8.

Figure 9:
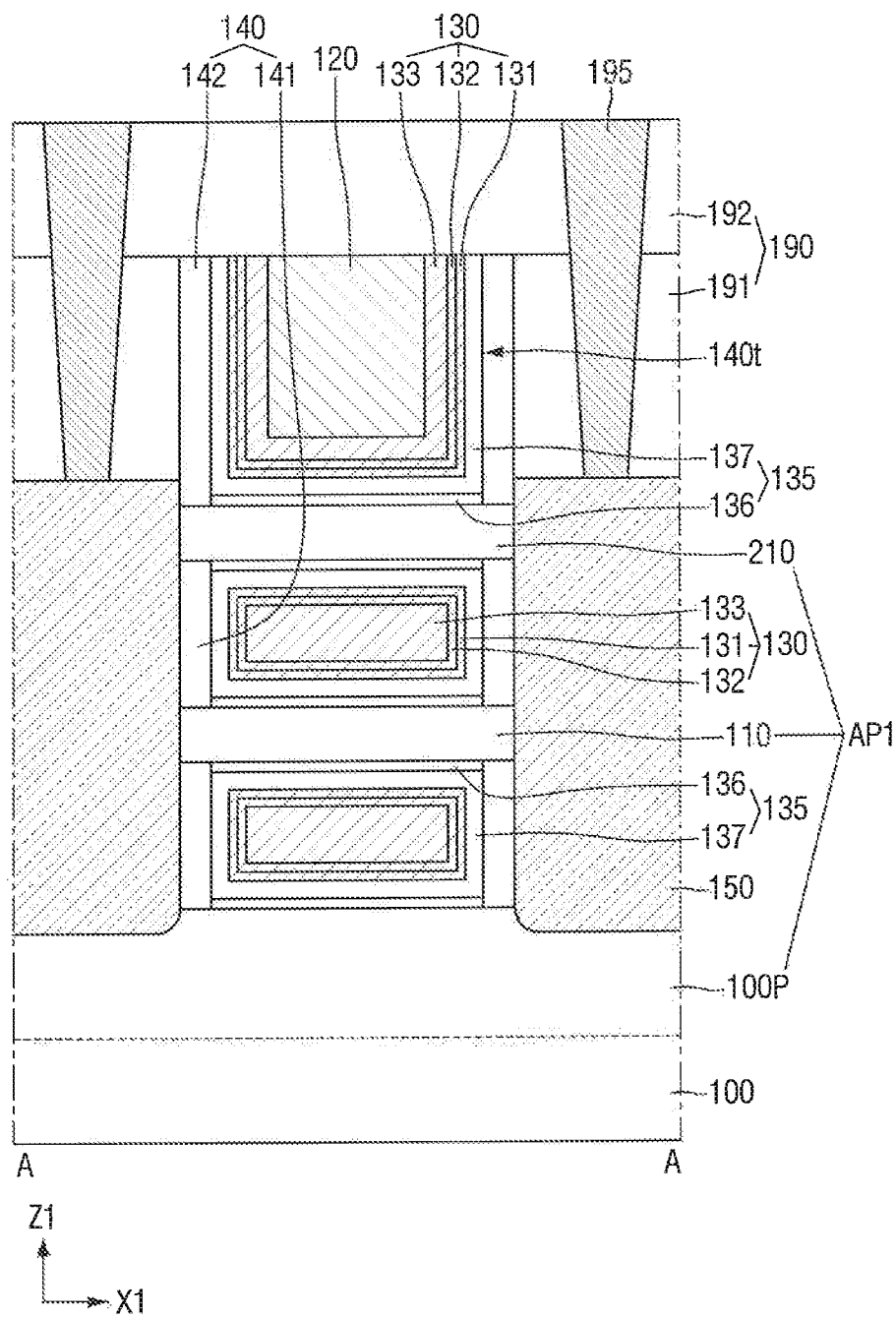
FIG. 9 is a semiconductor device taken along line A-A of FIG. 1 according to an embodiment of the present inventive concept.

FIG. 9 is a diagram for explaining the semiconductor device according to some embodiments. For reference, FIG. 9 is a cross-sectional view taken along A-A of FIG. 1. For convenience of explanation, elements different from those explained using FIGS. 1 to 3 will be mainly explained and a repeated description of similar or identical elements may be omitted.

Referring to FIG. 9, a semiconductor device according to some embodiments may further include a contact 195 connected to the first source/drain pattern 150.

The contact 195 may penetrate the interlayer insulating film 190 (e.g., in the third direction Z1) and may be disposed on the first source/drain pattern 150. Although the drawing shows that the contact 195 does not enter the first source/drain pattern 150 and a lower surface of the contact 195 directly contacts an upper surface of the first source/drain pattern 150, embodiments of the present inventive concept are not limited thereto. For example, in some embodiments, the contact 195 may be inserted into the first source/drain pattern 150 and a lower surface of the contact 195 may extend below an uppermost surface of the first source/drain pattern 150. Further, in an embodiment, an etching stop film that protects the first source/drain pattern 150 may be further formed between the first source/drain pattern 150 and the lower interlayer insulating film 191. The etching stop film may include a material having an etching selectivity to the lower interlayer insulating film 191.

In an embodiment, the contact 195 may include, for example, at least one compound selected from tantalum (Ta), tantalum nitride (TaN), titanium (Ti), titanium nitride (TiN), tungsten nitride (WN), tungsten carbonitride (WCN), tungsten (W), cobalt (Co), ruthenium (Ru), molybdenum (Mo), nickel (Ni), aluminum (Al), copper (Cu) and doped polysilicon. However, embodiments of the present inventive concept are not limited thereto. In an embodiment, a silicide film may also be disposed between the contact 195 and the first source/drain pattern 150.

In an embodiment, the first work function adjustment pattern 130 shown in FIGS. 4 to 7 may be applied to the first work function adjustment pattern 130 shown in FIG. 9.

Figure 10:
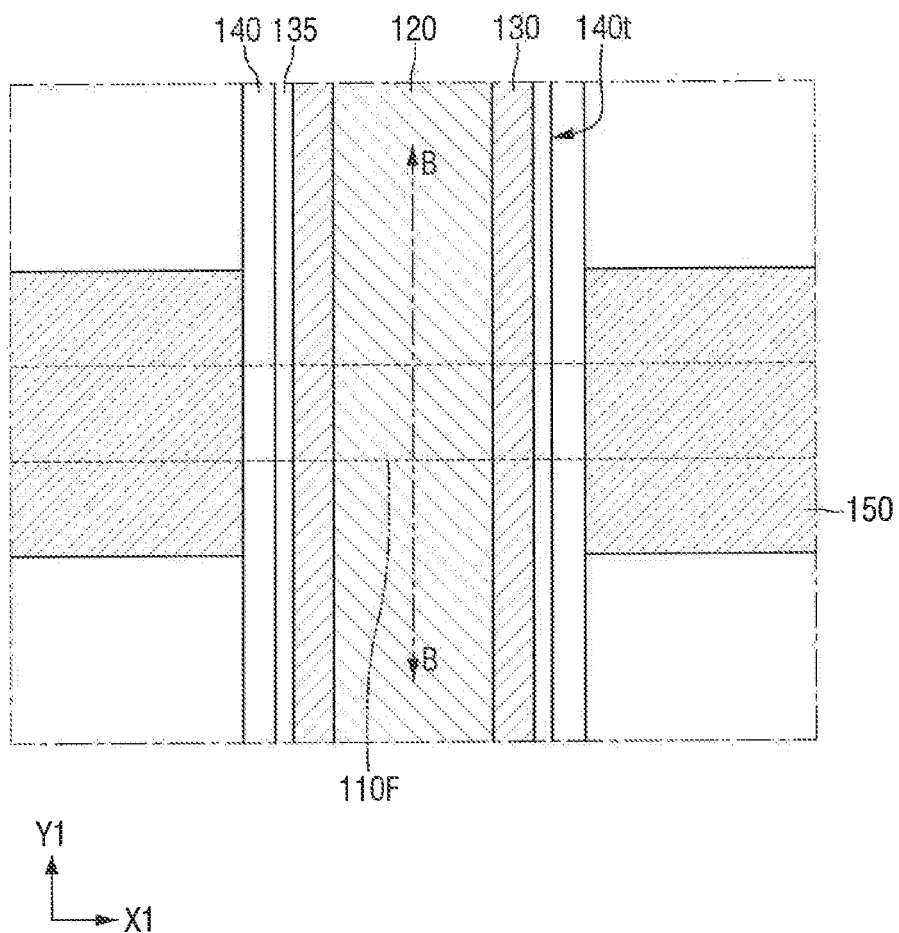
FIG. 10 is a plan view of a semiconductor device according to an embodiment of the present inventive concept.
Figure 11:
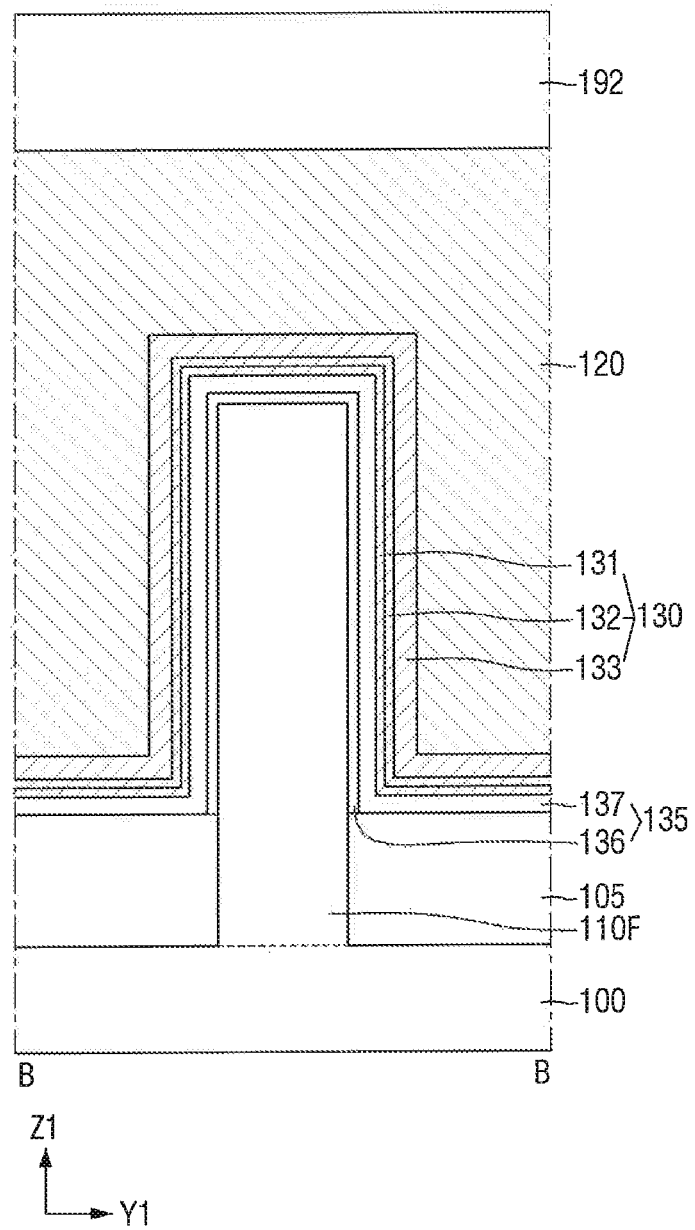
FIG. 11 is a semiconductor device taken along line B-B of FIG. 10 according to an embodiment of the present inventive concept.

FIGS. 10 and 11 are diagrams for explaining a semiconductor device according to some embodiments. For reference, FIG. 11 is a cross-sectional view taken along B-B of FIG. 10. For convenience of explanation, elements different from those explained using FIGS. 1 to 3 will be mainly explained and a repeated description of similar or identical elements may be omitted.

Referring to FIGS. 10 and 11, in the semiconductor device according to some embodiments, the first active pattern may be a fin-type pattern 110F. A portion of the fin-type pattern 110F may protrude upward from the upper surface of the field insulating film 105. In an embodiment, the fin-type pattern 110F may include silicon or germanium, which is an elemental semiconductor material. Further, the fin-type pattern 110F may include, for example, a group IV-IV compound semiconductor or a group III-V compound semiconductor. However, embodiments of the present inventive concept are not limited thereto.

The first interfacial layer 136 may be disposed along the profile of the fin-type pattern 110F protruding upward from the upper surface of the field insulating film 105. The first high-dielectric constant insulating film 137 and the first work function adjustment pattern 130 may be disposed along the profile of the fin-type pattern 110E and the upper surface of the field insulating film 105, respectively.

The first work function adjustment pattern 130 shown in FIGS. 4 to 7 may, of course, be applied to the first work function adjustment pattern 130 shown in FIG. 11.

Figure 12:
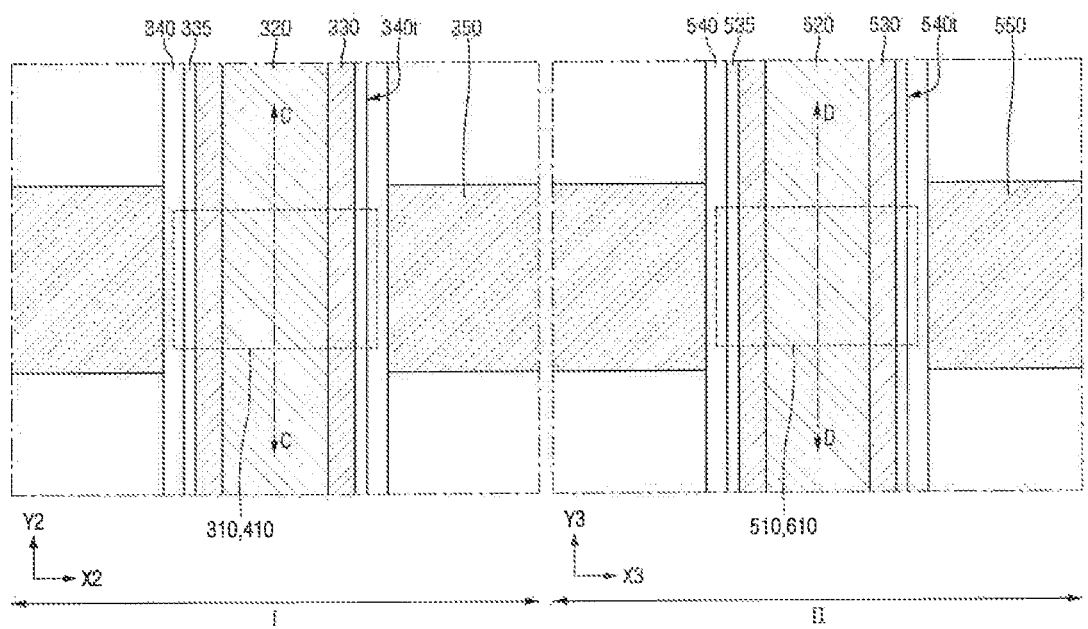
FIG. 12 is a plan view of a semiconductor device according to an embodiment of the present inventive concept.
Figure 13:
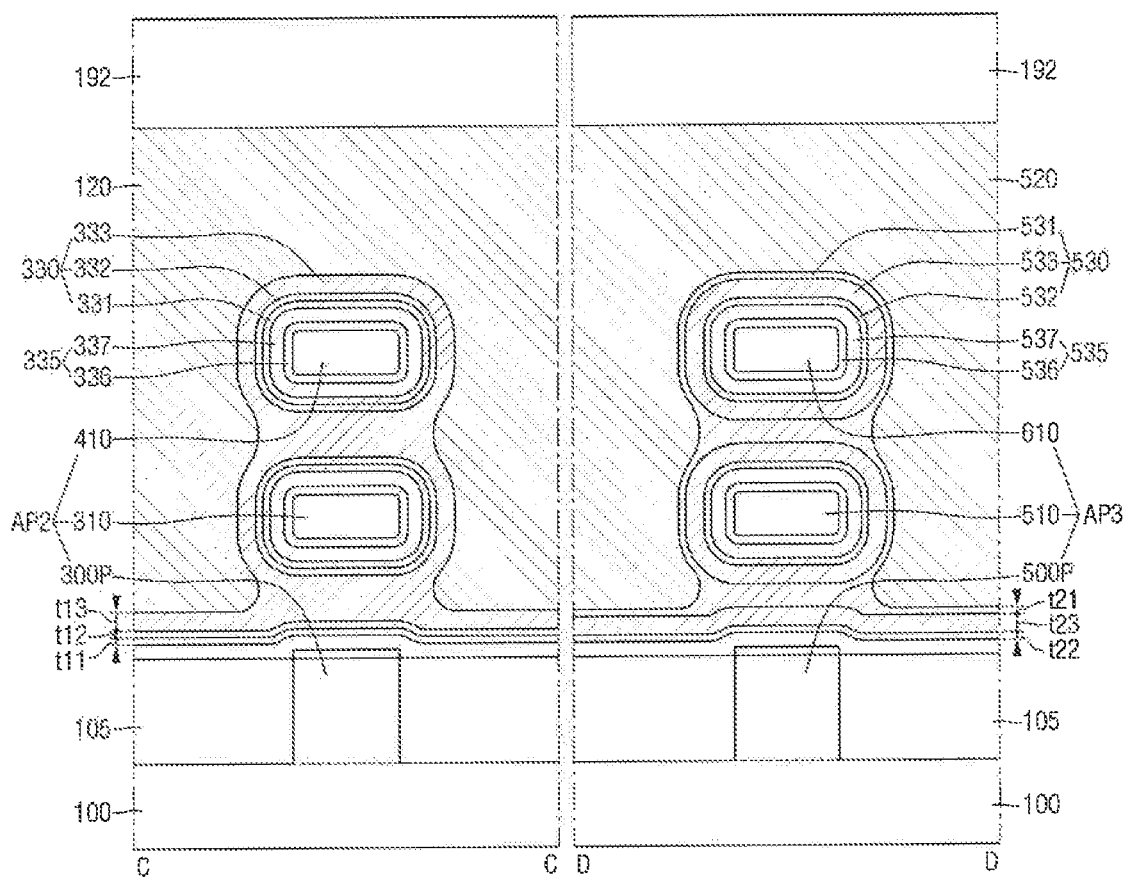
FIG. 13 is cross-sectional views of a semiconductor device taken along lines C-C and D-D of FIG. 12 according to some embodiments of the present inventive concept.

FIGS. 12 and 13 are diagrams for explaining a semiconductor device according to some embodiments. For reference, FIG. 13 is a cross-sectional view taken along C-C and D-D of FIG. 12.

Referring to FIGS. 12 and 13, in the semiconductor device according to some embodiments, the substrate 100 may include a first region I and a second region II. The first region I and the second region II may be regions spaced apart from each other, or may be regions connected to each other. For example, the first region I may be a PMOS region, and the second region II may be a NMOS region.

A second active pattern AP2, a second gate electrode 320, a second work function adjustment pattern 330, a second gate insulating film 335, a second gate spacer 340, and a second gate trench 340t may be disposed in the first region I of the substrate 100. The second active pattern AP2 may extend longitudinally in a fourth direction X2. The second gate electrode 320, the second work function adjustment pattern 330, the second gate insulating film 335, and the second gate spacer 340 may extend longitudinally in a fifth direction Y2. The fifth direction Y2 may intersect the fourth direction X2. For example, the fifth direction Y2 may be perpendicular to the fourth direction X2. However, embodiments of the present inventive concept are not limited thereto. A second source/drain pattern 350 may be disposed on at least one side of the second gate electrode 320. The second work function adjustment pattern 330 may include a second barrier film 331, a third work function adjustment film 332, and a fourth work function adjustment film 333. The second gate insulating film 335 may include a second interfacial layer 336 and a second high-dielectric constant insulating film 337.

A third active pattern AP3, a third gate electrode 520, a third work function adjustment pattern 530, a third gate insulating film 535, a third gate spacer 540, and a third gate trench 140t may be disposed in the second region II of the substrate 100. The third active pattern AP3 may extend longitudinally in a sixth direction X3. The third gate electrode 520, the third work function adjustment pattern 530, the third gate insulating film 535 and the third gate spacer 540 may extend longitudinally in a seventh direction Y3. The seventh direction Y3 may intersect the sixth direction X3. For example, the seventh direction Y3 may be perpendicular to the sixth direction X3. However, embodiments of the present inventive concept are not limited thereto. The third source/drain pattern 550 may be disposed on at least one side of the third gate electrode 520. The third work function adjustment pattern 530 may include a fifth work function adjustment film 532, a sixth work function adjustment film 533, and a third barrier film 531. The third gate insulating film 535 may include a third interfacial layer 536 and a third high-dielectric constant insulating film 537.

Each of the second active pattern AP2, the second gate electrode 320, the second work function adjustment pattern 230, the second gate insulating film 235, the second gate spacer 240 and the second gate trench 240t may correspond to each of the first active pattern AP1, the first gate electrode 120, the first work function adjustment pattern 130, the first gate insulating film 135, and the first gate spacer 140 and the first gate trench 140t of FIGS. 1 to 3. Each of the second barrier film 331, the third work function adjustment film 332, and the fourth work function adjustment film 333 may correspond to each of the first harrier film 131, the first work function adjustment film 132 and the second work function adjustment film 133 of FIGS. 1 to 3. Each of the second interfacial layer 336 and the second high-dielectric constant insulating film 337 may correspond to each of the first interfacial layer 136 and the first high-dielectric constant insulating film 137 of FIGS. 1 to 3.

Each of the third active pattern AP3, the third gate electrode 520, the third work function adjustment pattern 530, the third gate insulating film 535, the third gate spacer 540 and the third gate trench 140t may correspond to each of the first active pattern AP1, the first gate electrode 120, the first work function adjustment pattern 130, the first gate insulating film 135, the first gate spacer 140, and the first gate trench 140t of FIGS. 6 and 7. Each of the fifth work function adjustment film 532, the sixth work function adjustment film 533 and the third barrier film 511 may correspond to each of the first work function adjustment film 132, the second work function adjustment film 111 and the first harrier film 131 of FIGS. 6 and 7. Each of the third interfacial layer 536 and the third high-dielectric constant insulating film 537 may correspond to each of the first interfacial layer 136 and the first high-dielectric constant insulating film 137 of FIGS. 6 and 7.

In the semiconductor device according to some embodiments, the second barrier film 331 may be disposed between the third work function adjustment film 332 and the second high-dielectric constant insulating film 337, and the third barrier film 531 may wrap the sixth work function adjustment film 533. The threshold voltage of the transistor of the first region I and the threshold voltage of the transistor of the second region II may be adjusted differently, depending on the positions of the second barrier film 331 and the third barrier film 531.

On the substrate 100, the second barrier film 331 may have a first thickness t11, the third work function adjustment film 332 may have a second thickness t12, and the fourth work function adjustment film 333 may have a third thickness t13. In an embodiment, the third thickness t13 may be greater than the first thickness t11 and the second thickness t12. The second thickness t12 may be different from or the same as the first thickness t11. On the substrate 100, the third harrier film 531 may have a fourth thickness t21, the fifth work function adjustment film 532 may have a fifth thickness t22, and the sixth work function adjustment film 533 may have a sixth thickness t23. In an embodiment, the sixth thickness t23 may be greater than the fourth thickness t21 and the fifth thickness t22, The fourth thickness t21 may be different from or the same as the fifth thickness t22. Each of the first thickness t11, the second thickness t12 and the third thickness t13 may be the same as or different from each of the fourth thickness t21, the fifth thickness t22 and the sixth thickness t23. Further, the upper surface of the fourth work function adjustment film 333 disposed on the field insulating film 105 may be disposed on the same plane as or different plane from the upper surface of the third barrier film 531 disposed on the field insulating film 105.

Figure 14:
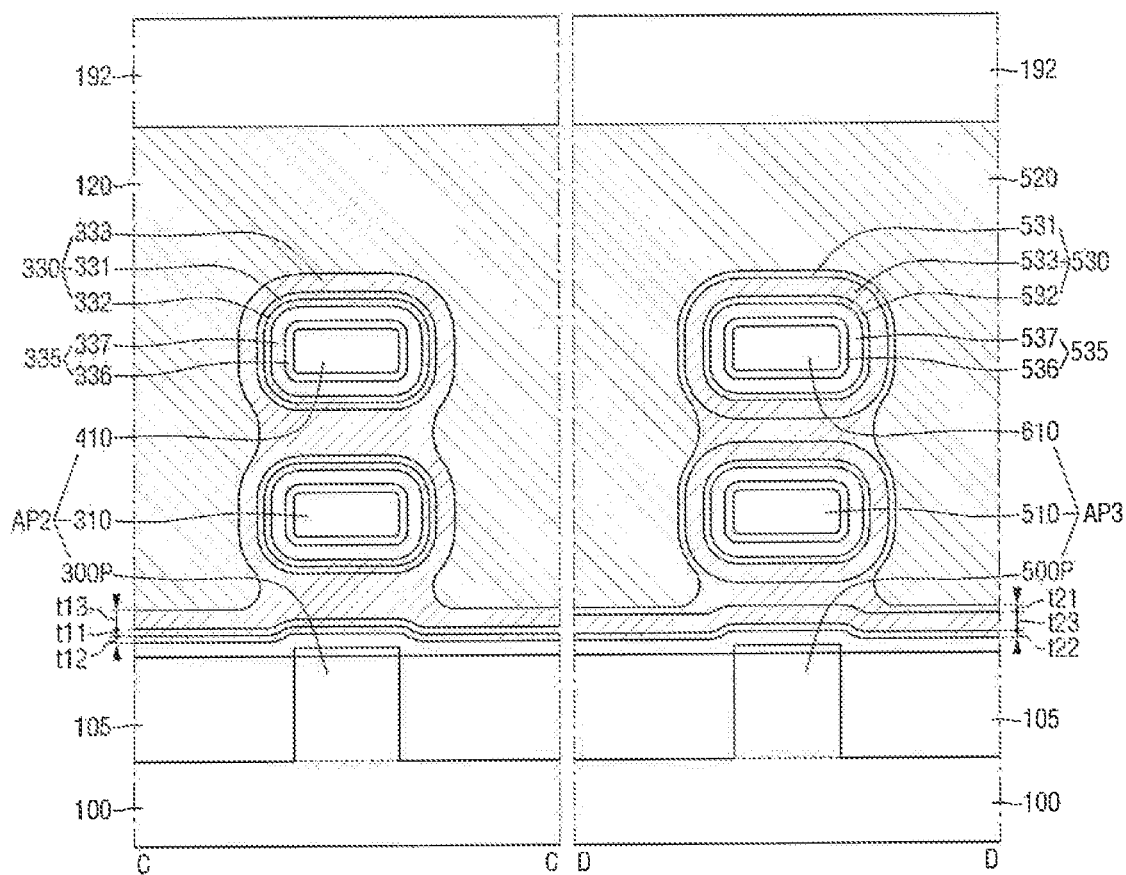
FIG. 14 is cross-sectional views of a semiconductor device taken along lines C-C and D-D of FIG. 12 according to some embodiments of the present inventive concept.

FIG. 14 is a diagram for explaining a semiconductor device according to some embodiments. For reference, FIG. 14 is a cross-sectional view taken along C-C and D-D of FIG. 12. For convenience of explanation, elements different from those explained using FIGS. 12 and 13 will be mainly explained and a repeated description of similar or identical elements may be omitted.

Referring to FIGS. 12 and 14, in the semiconductor device according to some embodiments, the second barrier film 331 may be disposed between the third work function adjustment film 332 and the fourth work function adjustment film 333.

Each of the second active pattern AP2, the second gate electrode 320, the second work function adjustment pattern 230, the second gate insulating film 235, the second gate spacer 240 and the second gate trench 240t may correspond to each of the first active pattern AP1, the first gate electrode 120, the first work function adjustment pattern 130, the first gate insulating film 135, the first gate spacer 140 and the first gate trench 140t of FIGS. 4 and 5. Each of the second barrier film 331, the third work function adjustment film 332, and the fourth work function adjustment film 333 may correspond to each of the first barrier film 131, the first work function adjustment film 132 and the second work function adjustment film 133 of FIGS. 4 and 5.

Figure 15:
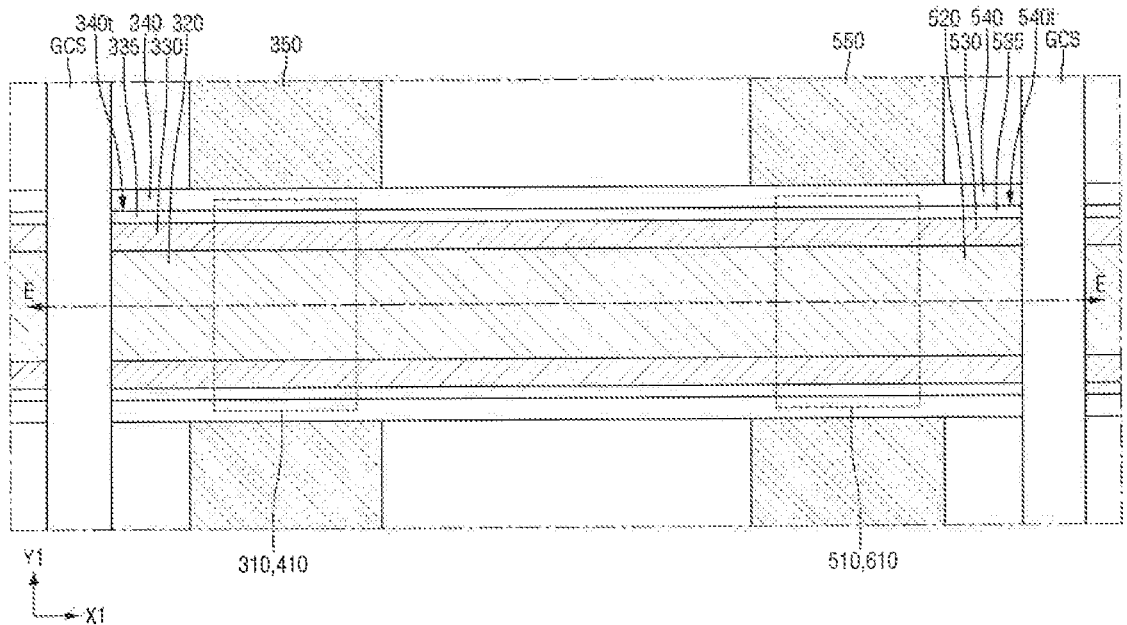
FIG. 15 is a plan view of a semiconductor device according to an embodiment of the present inventive concept.
Figure 16:
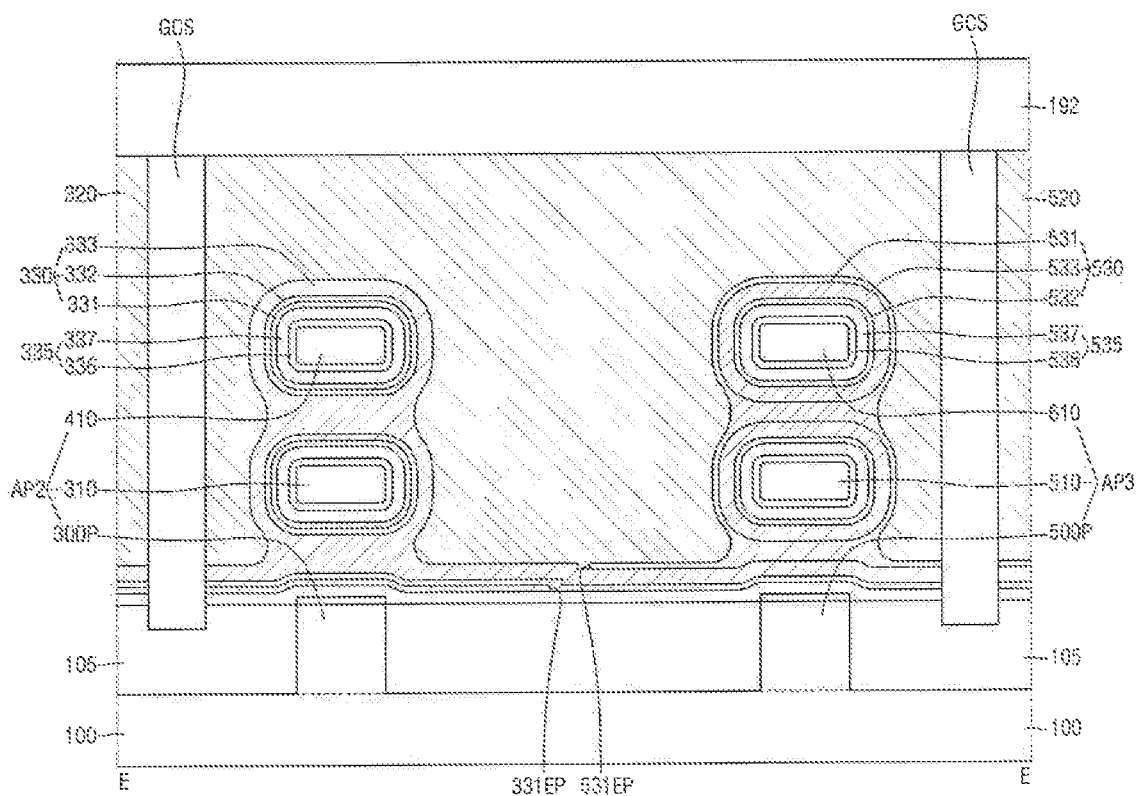
FIGS. 16-17 are cross-sectional views of a semiconductor device taken along line E-E of FIG. 15 according to embodiments of the present inventive concept.
Figure 17:
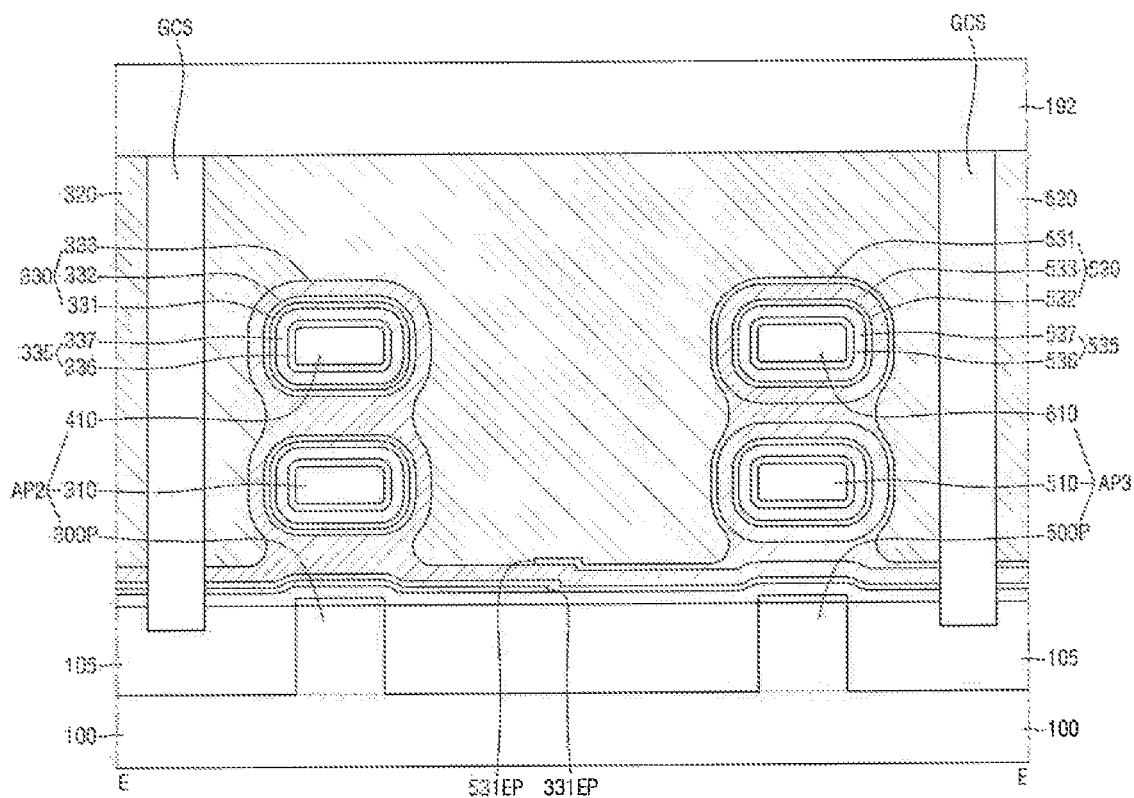

FIGS. 15 and 17 are diagrams for explaining a semiconductor device according to some embodiments. For reference, FIGS. 16 and 17 are cross-sectional views taken along E-E of FIG. 15. For convenience of explanation, elements different from those explained using FIGS. 12 and 13 will be mainly explained and a repeated description of similar or identical elements may be omitted. The fourth direction X2 and the sixth direction X3 of FIGS. 12 and 13 may correspond to the first direction X1, and the fifth direction Y2 and the seventh direction Y3 may correspond to the second direction Y1.

Referring to FIGS. 15 to 17, in the semiconductor devices according to some embodiments, the second active pattern AP2 and the third active pattern AP3 may be disposed on the substrate 100. The second active pattern AP2 and the third active pattern AP3 may each extend longitudinally in the second direction Y1. The second active pattern AP2 and the third active pattern AP3 may be adjacent to each other in the first direction X1. The second active pattern AP2 and the third active pattern AP3 may be disposed to be spaced apart from each other in the first direction X1.

The second barrier film 331 is disposed on the second active pattern AP2, but is not disposed on the third active pattern AP3. The second barrier film 331 does not extend to the third active pattern AP3. The second barrier film 331 is not disposed on the third gate insulating film 535. The second barrier film 331 does not wrap the respective third sheet patterns 510 and 610. The second barrier film 331 is not disposed along the periphery of each of the third sheet patterns 510 and 610.

The third barrier film 531 is disposed on the third active pattern AP3, but is not disposed on the second active pattern AP2. The third barrier film 531 does not extend to the second active pattern AP2. The third barrier film 531 is not disposed on the fourth work function adjustment film 333. The third barrier film 531 does not wrap the respective second sheet patterns 310 and 410. The third barrier film 531 is not disposed along the periphery of each of the second sheet patterns 310 and 410.

The second barrier film 331 may include a first end 331EP of the second barrier film 331 disposed on the upper surface of the field insulating film 105 between the second active pattern AP2 and the third active pattern AP3. The third barrier film 531 may include a first end 531EP of the third barrier film 531 disposed on the upper surface of the field insulating film 105 between the second active pattern AP2 and the third active pattern AP3. Referring to FIG. 16, the second barrier film 331 may not overlap the third barrier film 531 on the field insulating film 105. Referring to FIG. 17, the second barrier film 331 may overlap at least a portion of the third barrier film 531 on the field insulating film 105. For example, the first end 531EP of the third barrier film 531 may overlap the first end 331EP of the second barrier film 331.

In the semiconductor device according to some embodiments, when the second gate electrode 320 and the third gate electrode 520 come into direct contact with each other, the second gate electrode 320 and the third gate electrode 520 may be divided on the basis of the second barrier film 331 or the third barrier film 531. For example, the second gate electrode 320 and the third gate electrode 520 may be divided by the first end 331EP of the second barrier film or the first end 531EP of the third barrier film.

A gate cut structure GCS may be disposed on the substrate 100. The gate cut structure GCS may be disposed on the field insulating film 105. For example, in an embodiment, the gate cut structure GCS may penetrate the field insulating film 105 and a lower surface of the gate cut structure GCS may be lower than an upper surface of the field insulating film 105. However, embodiments of the present inventive concept are not limited thereto. The gate cut structures GCS may be disposed to be spaced apart from each other in the first direction X1. The second active pattern AP2 and the third active pattern AP3 may be disposed between the gate cut structures GCS adjacent to each other in the first direction X1. For example, the second lower pattern 300P and the third lower pattern 500P may be disposed between the gate cut structures GCS adjacent to each other in the first direction X1.

The second gate electrode 320 and the third gate electrode 520 may be disposed between the gate cut structures GCS adjacent to each other in the first direction X1. The gate cut structure GCS may separate the gate electrodes adjacent to each other in the first direction X1.

As shown in the embodiment of FIG. 17, the second gate insulating film 335 and the third gate insulating film 535 may not extend along the side walls of the gate cut structure GCS. However, embodiments of the present inventive concept are not limited thereto. Further, the upper surface of the second gate electrode 320 and the upper surface of the third gate electrode 520 may be disposed on the same plane as the upper surface of the gate cut structure GCS. However, embodiments of the present inventive concept are not limited thereto.

The gate cut structure GCS may be disposed, for example, along the boundary of the standard cells. For example, the first gate cut structure GCS1 may be a standard cell separation structure. However, embodiments of the present inventive concept are not limited thereto. For example, in an embodiment, the gate cut structure GCS may be a gate separation structure disposed inside the SRAM region. In this embodiment, the second active pattern AP2 may be a region in which a pull-up transistor of SRAM is formed, and the third active pattern AP3 may be a region in which a pull-down transistor of SRAM is formed. However, embodiments of the present inventive concept are not limited thereto.

The gate cut structure GCS may include, for example, at least one compound selected from silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), aluminum oxide (AlO), and combinations thereof. Although the gate cut structure GCS is shown as a single film, embodiments of the present inventive concept are not limited thereto.

FIGS. 18 to 24 are intermediate stage diagrams for explaining a method for fabricating the semiconductor device according to some embodiments. FIGS. 19 to 24 are cross-sectional views taken along G-G of FIG. 18, respectively.

Figure 18:
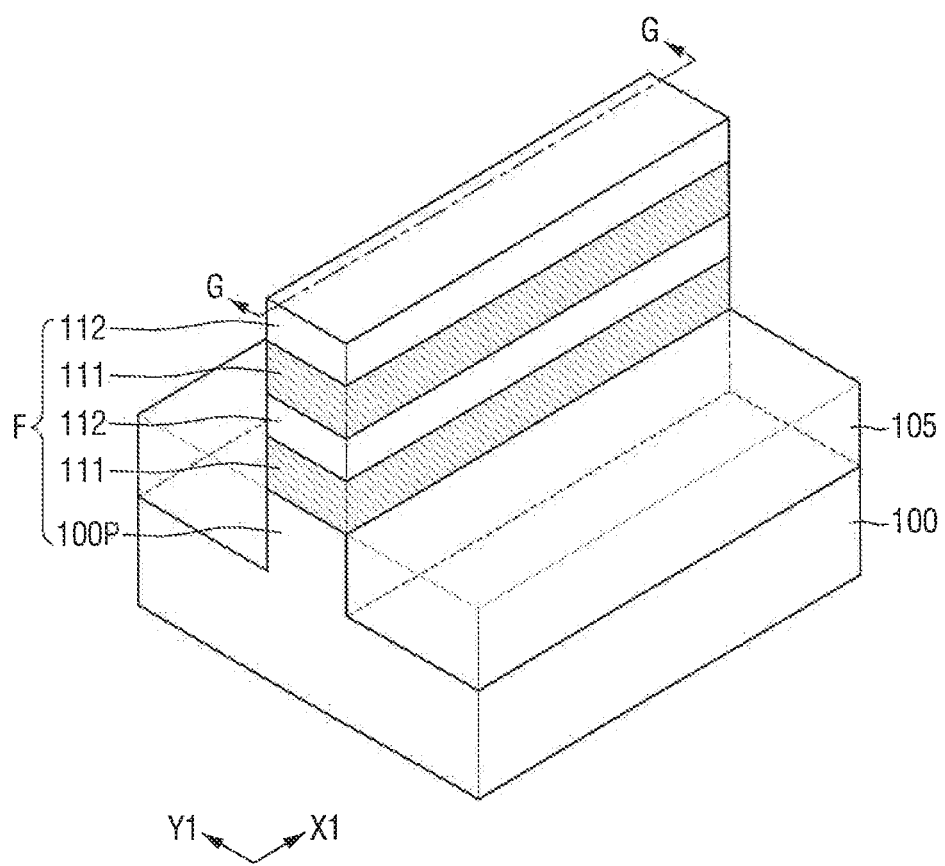
FIG. 18 is a perspective view of an intermediate stage of a method for fabricating a semiconductor device according to an embodiment of the present inventive concepts.

Referring to FIG. 18, a fin-type structure F may be formed on the substrate 100. The fin-type structure F may extend longitudinally in the first direction X1.

The fin-type structure F may include a first lower pattern 100P, a sacrificial pattern 111, an active pattern 112, a sacrificial pattern 111, and an active pattern 112, which are sequentially stacked on the substrate 100. Since the fin-type structure F extends longitudinally in the first direction X1, each of the sacrificial patterns 111 and the active patterns 112 may extend longitudinally in the first direction X1. The active pattern 112 may include a material having an etching selectivity to the sacrificial pattern 111. A field insulating film 105 that covers at least a portion of the side wall of the fin-type structure F may be formed on the substrate 100.

Although the active pattern 112 is shown as being disposed at the uppermost portion of the fin-type structure F, embodiments of the present inventive concept are not limited thereto. Also, although the fin-type structure F is shown to include three active patterns 112 formed on the substrate 100, embodiments of the present inventive concept are not limited thereto and the numbers of the active patterns may vary.

Figure 19:
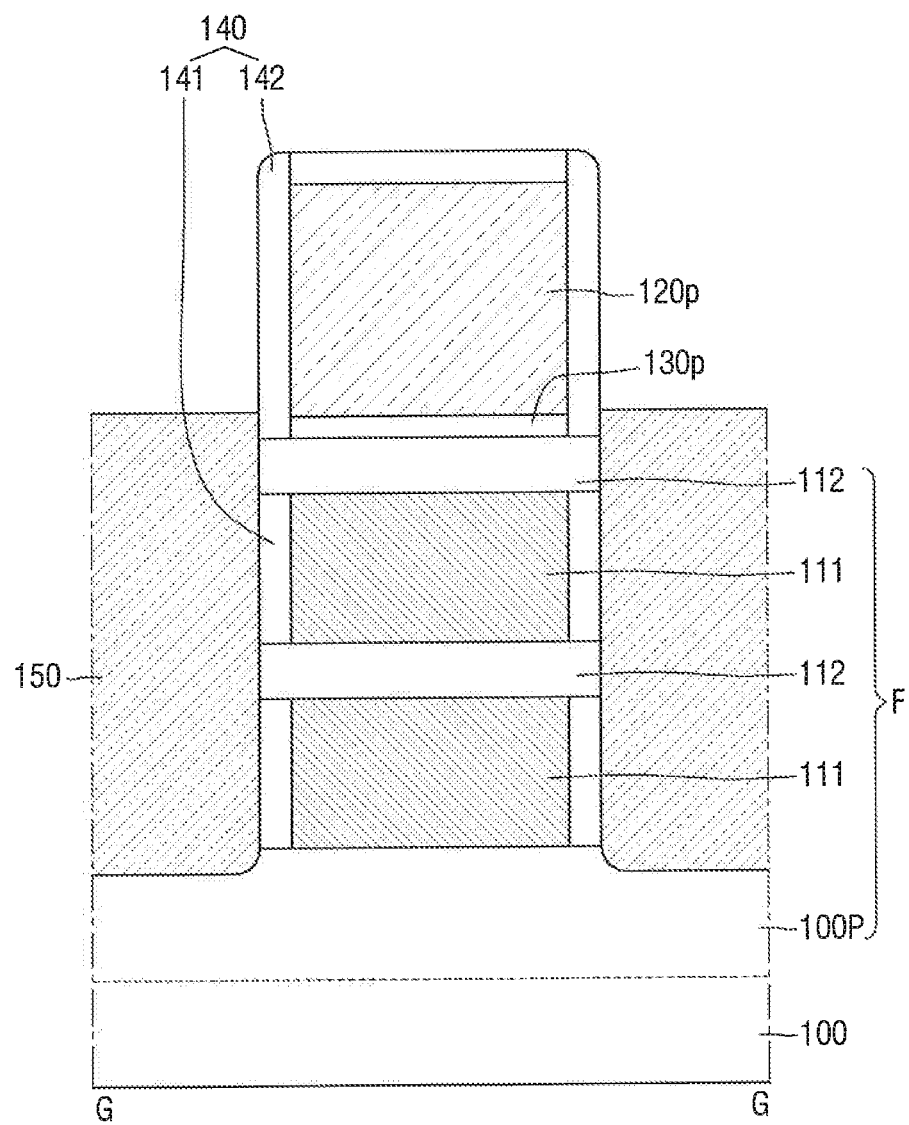
FIGS. 19 to 24 are intermediate stage diagrams of a method for fabricating a semiconductor device taken along line G-G of FIG. 18 according to some embodiments of the present inventive concepts.

Referring to FIG. 19, a dummy gate electrode 120p that intersects the fin-type structure F and extends longitudinally in the second direction (Y1 of FIG. 18) may be formed.

A dummy gate insulating film 130p may be formed between the dummy gate electrode 120p and the fin-type structure F (e.g., in a thickness direction of the substrate 100). A hard mask pattern may be formed on the dummy gate electrode 120p. A first outer spacer 142 may be formed on the side wall of the dummy gate electrode 120p. A portion of the fin-type structure F may be removed, by utilizing the dummy gate electrode 120p and the first outer spacer 142 as masks.

After removing a portion of the fin-type structure F, a first inner spacer 141 is formed between the active pattern 112 and the first lower pattern 100P. The first inner spacer 141 is also formed between the active patterns 112 on the first lower pattern 100P. The first gate spacer 140 is formed accordingly. For example, in an embodiment, at least a portion of the sacrificial pattern 111 that overlaps the first outer spacer 142 may be removed, using the etching selectivity between the active pattern 112 and the sacrificial pattern 111. The first inner spacer 141 may be formed in the portion from which a portion of the sacrificial pattern 111 is removed.

In an embodiment, a first source/drain pattern 150 may be subsequently formed on the substrate 100 on both sides of the dummy gate electrode 120p and the first gate spacer 140. The first source/drain pattern 150 may be formed on the first lower pattern 100P. The first source/drain pattern 150 may be connected to the active pattern 112.

Figure 20:
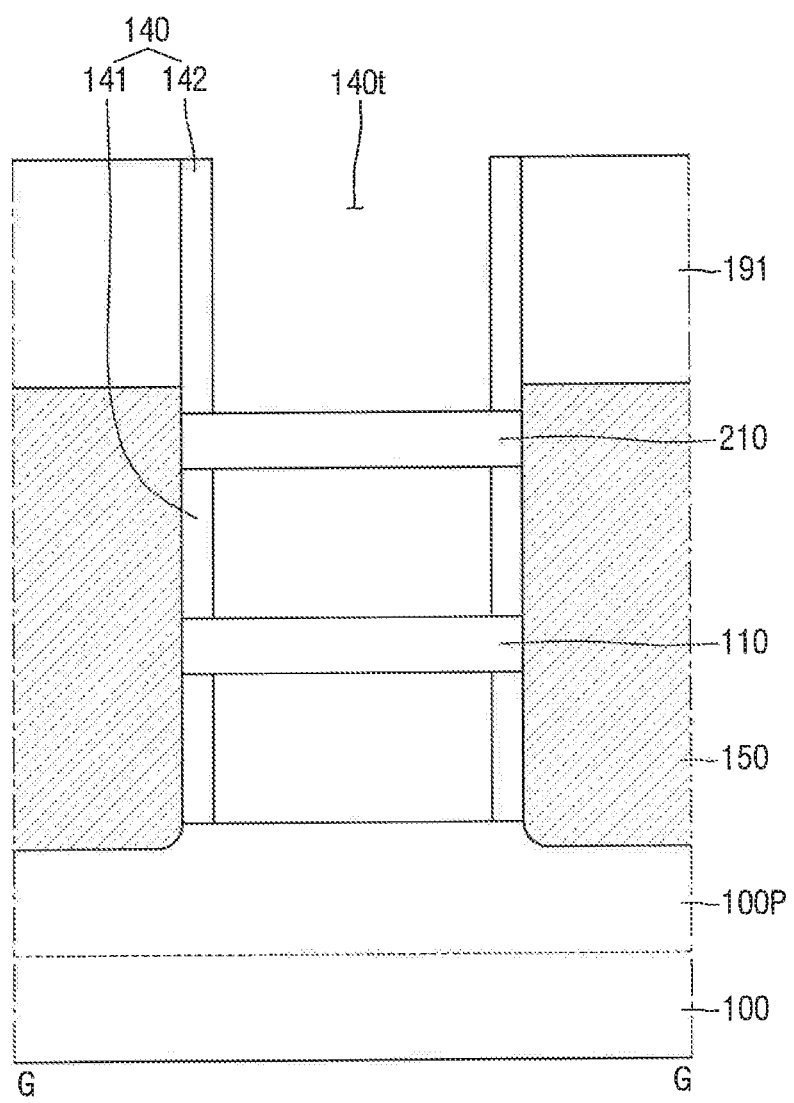

Referring to FIGS. 19 and 20, a lower interlayer insulating film 191 may be formed on the first source/drain pattern 150. The dummy gate electrode 120p may be exposed by the lower interlayer insulating film 191. The hard mask pattern 2101 may be removed, while the lower interlayer insulating film 191 is formed.

A plurality of first sheet patterns 110 and 210 may be sequentially placed on the substrate 100 by removing the dummy gate electrode 120p, the dummy gate insulating film 130p, and the sacrificial pattern 111. Each of the first sheet patterns 110 and 210 may be formed to be spaced apart from the first lower pattern 100P. A first gate trench 140t defined by the first gate spacer 140 may be formed, by removing the dummy gate electrode 120p, the dummy gate insulating film 130p, and the sacrificial pattern 111.

Figure 21:
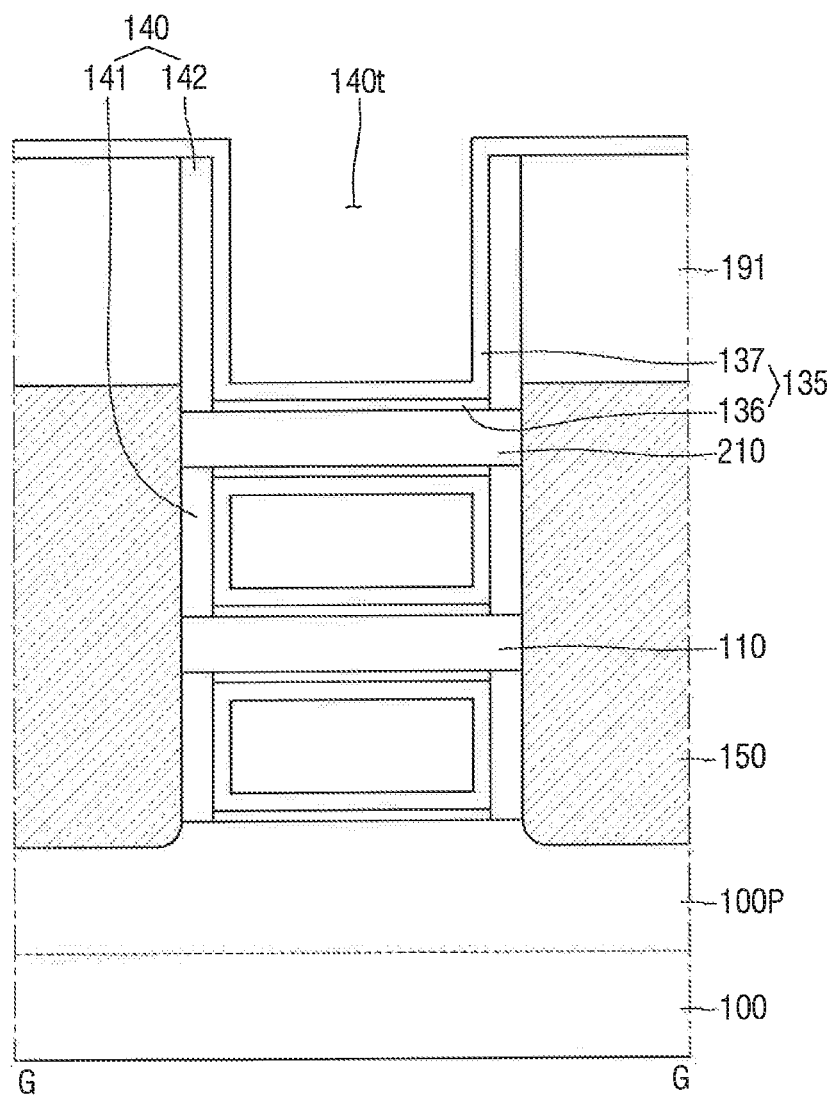

Referring to FIG. 21, the first gate insulating film 135 may be formed along the respective first sheet patterns 110 and 210.

The first gate insulating film 135 may be formed along the side walls and the bottom surface of the first gate trench 140t and the periphery of the respective first sheet patterns 110 and 210. The first gate insulating film 135 includes a first interfacial layer 136 and a first high-dielectric constant insulating film 137. The first high-dielectric constant insulating film 137 may also be formed on the upper surface of the lower interlayer insulating film 191.

Figure 22:
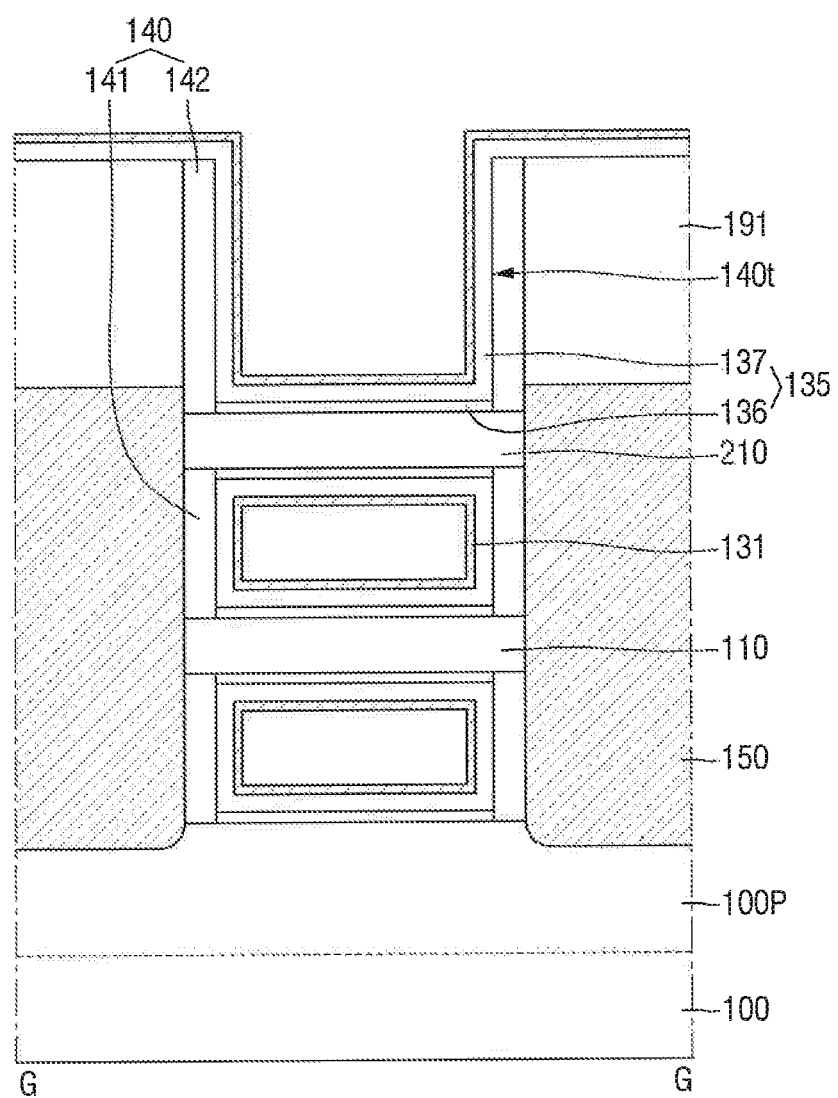

Referring to FIG. 22, the first barrier film 131 may be formed on the first gate insulating film 135. The first barrier film 131 may be formed along the profile of the first high-dielectric constant insulating film 137. The first barrier film 131 may also be formed on the upper surface of the lower interlayer insulating film 191. In an embodiment, the first barrier film 131 may be formed using an atomic layer deposition method. However, embodiments of the present inventive concept are not limited thereto. The first barrier film 131 may be formed, using a vapor deposition method such as a physical vapor deposition or a chemical vapor deposition.

Figure 23:
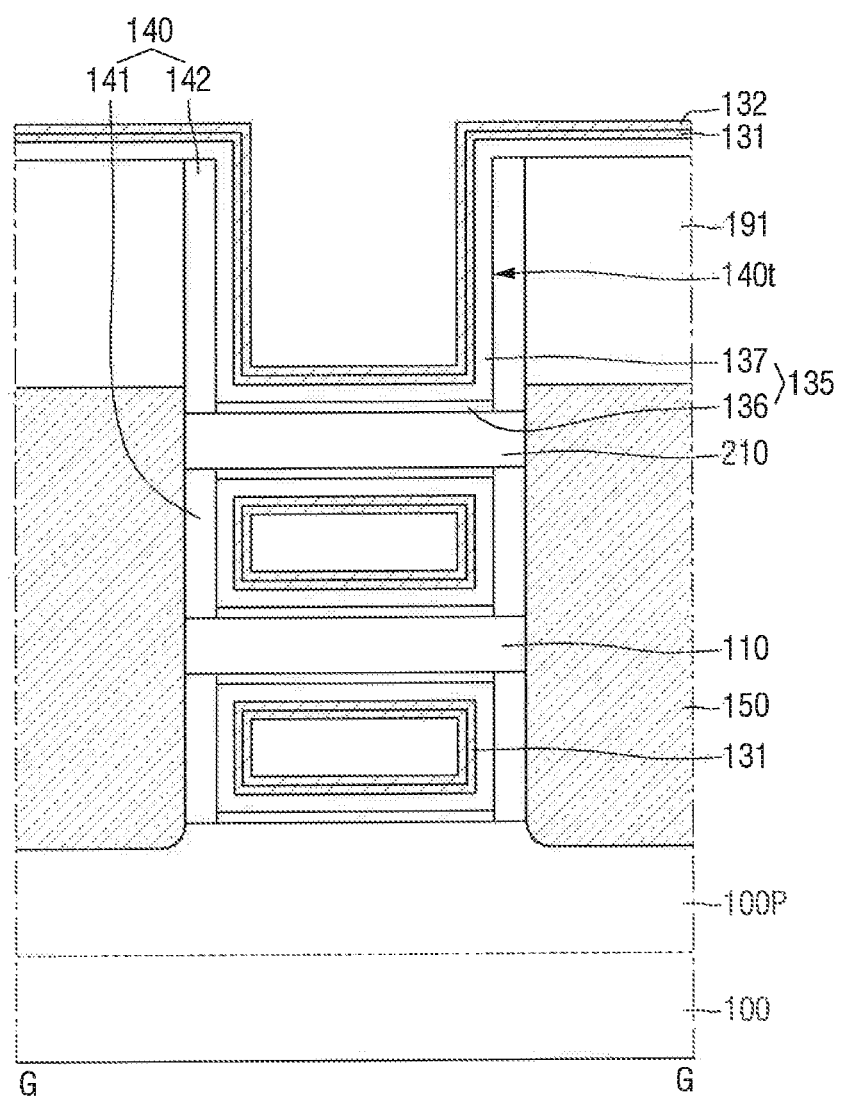

Referring to FIG. 23, the first work function adjustment film 132 may be formed on the first barrier film 131.

The first work function adjustment film 132 may be formed along the profile of the first barrier film 131. In an embodiment, the first work function adjustment film 132 may be formed, using an atomic layer deposition method. However, embodiments of the present inventive concept are not limited thereto. For example, the first work function adjustment film 132 may be formed, using a vapor deposition method such as a physical vapor deposition or a chemical vapor deposition.

Figure 24:
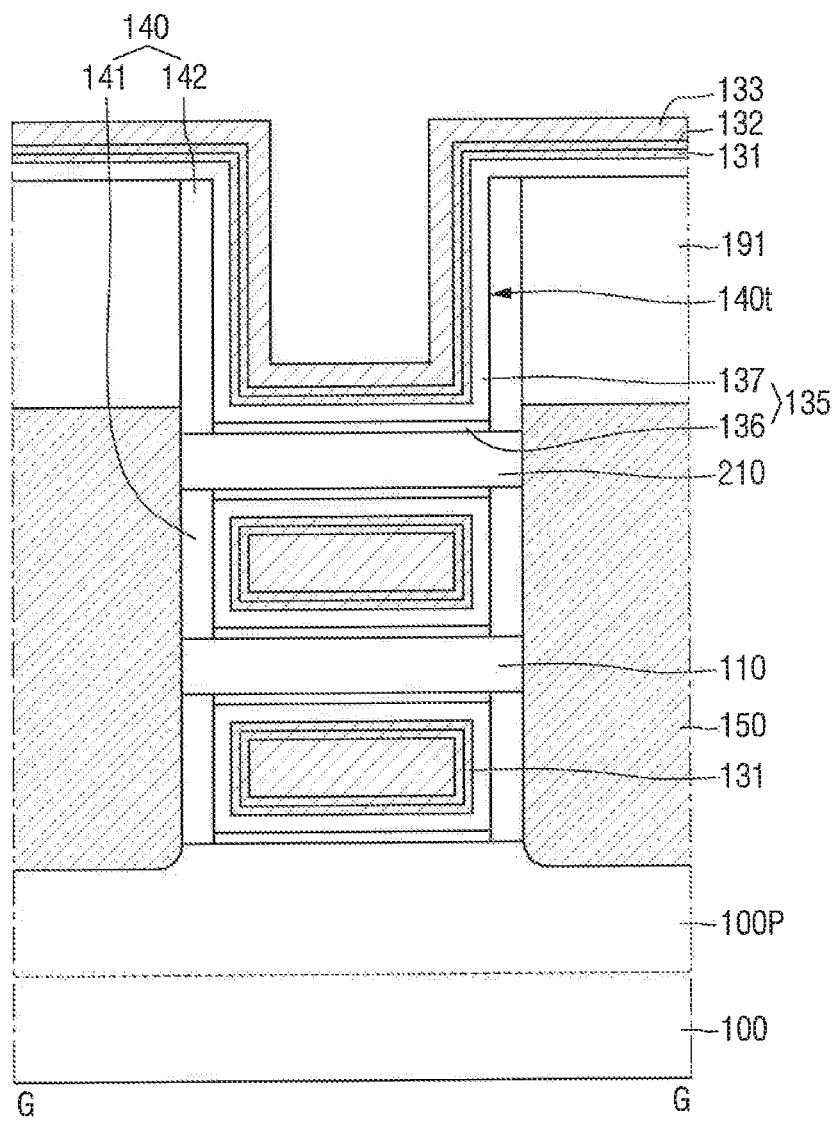

Referring to FIG. 24, the second work function adjustment film 133 may be formed on the first work function adjustment film 132.

The second work function adjustment film 133 may be formed along the profile of the first work function adjustment film 132. In an embodiment, the second work function adjustment film 133 may be formed using an atomic layer deposition method. However, embodiments of the present inventive concept are not limited thereto. The second work function adjustment film 133 may be formed, using a vapor deposition method such as a physical vapor deposition or a chemical vapor deposition.

Referring to FIG. 2, a first gate electrode 120 that fills the first gate trench 140t may be formed on the second work function adjustment film 133. The first high-dielectric constant insulating film 137, the first barrier film 131, the first work function adjustment film 132, the second work function adjustment film 133 and the first gate electrode 120 on the upper surface of the lower interlayer insulating film 191 may be subsequently removed.

In concluding the detailed description, those skilled in the art will appreciate that many variations and modifications may be made to the non-limiting embodiments described herein without substantially departing from the principles of the present inventive concept. Therefore, the disclosed embodiments of the present inventive concept are used in a generic and descriptive sense only and not for purposes of limitation.

What is claimed is:

1. A semiconductor device comprising:
an active pattern disposed on a substrate;
a gate insulating film disposed on the active pattern and extending along the active pattern;
a work function adjustment pattern disposed on the gate insulating film and extending along the gate insulating film; and
a gate electrode disposed on the work function adjustment pattern,
wherein the work function adjustment pattern includes a first work function adjustment film, a second work function adjustment film that includes aluminum and wraps the first work function adjustment film, and a barrier film including titanium silicon nitride (TiSiN),
wherein an inner surface of the first work function adjustment film directly contacts the barrier film or the gate insulating film, and
a silicon concentration of the barrier film is in a range of about 30 at % or less.

2. The semiconductor device of claim 1, wherein:
the first work function adjustment film includes titanium nitride (TiN); and
the second work function adjustment film includes titanium aluminum carbide (TIAlC).

3. The semiconductor device of claim 1, wherein:
the first work function adjustment film is disposed directly on the gate insulating film; and the barrier film is disposed between the first work function adjustment film and the second work function adjustment film.

4. The semiconductor device of claim 1, wherein the barrier film is disposed between the gate insulating film and the first work function adjustment film.

5. The semiconductor device of claim 1, wherein:
the first work function adjustment film is disposed directly on the gate insulating film, and
the barrier film wraps the second work function adjustment film.

6. The semiconductor device of claim 1, wherein a thickness of the second work function adjustment film is greater than a thickness of the first work function adjustment film.

7. The semiconductor device of claim 1, wherein a thickness of the second work function adjustment film is greater than a thickness of the barrier film.

8. The semiconductor device of claim 1, wherein the gate insulating film includes:
a high-dielectric constant insulating film; and
an interfacial layer disposed between the high-dielectric constant insulating film and the active pattern.

9. The semiconductor device of claim 1, wherein the active pattern is a fin-type pattern.

10. The semiconductor device of claim 1, wherein the active pattern includes:
a lower pattern protruding from the substrate; and
a sheet pattern disposed on the lower pattern and spaced apart from the lower pattern in a thickness direction of the substrate.

11. A semiconductor device comprising:
a substrate including a first region and a second region;
a first active pattern disposed on the first region of the substrate;
a first gate insulating film disposed on the first active pattern and extending along the first active pattern;
a first work function adjustment pattern disposed on the first gate insulating film and extending along the first gate insulating film;
a first gate electrode disposed on the first work function adjustment pattern;
a second active pattern disposed on the second region of the substrate;
a second gate insulating film disposed on the second active pattern and extending along the second active pattern;
a second work function adjustment pattern disposed on the second gate insulating film and extending along the second gate insulating film; and
a second gate electrode disposed on the second work function adjustment pattern,
wherein the first work function adjustment pattern includes a first barrier film including titanium silicon nitride (TiSiN), and a first work function adjustment film that includes aluminum and wraps the first barrier film, and
the second work function adjustment pattern includes a second work function adjustment film including aluminum, and a second barrier film which includes titanium silicon nitride (TiSiN) and wraps the second work function adjustment film.

12. The semiconductor device of claim 11, wherein:
a thickness of the first work function adjustment film is greater than a thickness of the first barrier film; and
a thickness of the second work function adjustment film is greater than a thickness of the second barrier film.

13. The semiconductor device of claim 11, wherein:
the first work function adjustment pattern further includes a third work function adjustment film which includes titanium nitride (TiN) and is disposed between the first barrier film and the first work function adjustment film; and
the second work function adjustment pattern further includes a fourth work function adjustment film which includes titanium nitride (TiN) and is disposed between the second gate insulating film and the second work function adjustment film.

14. The semiconductor device of claim 11, wherein:
the first work function adjustment pattern further includes a third work function adjustment film that includes titanium nitride (TiN) and is disposed between the first gate insulating film and the first barrier film; and
the second work function adjustment pattern further includes a fourth work function adjustment film that includes titanium nitride (TiN) and is disposed between the second gate insulating film and the second work function adjustment film.

15. The semiconductor device of claim 11, further comprising:
a field insulating film that is disposed on the substrate between the first active pattern and the second active pattern, and directly contacts at least a portion of the first active pattern and at least a portion of the second active pattern,
wherein a first end of the first barrier film and a first end of the second barrier film are disposed on the field insulating film.

16. The semiconductor device of claim 15, wherein the first barrier film overlaps at least a portion of the second barrier film on the field insulating film in a thickness direction of the substrate.

17. The semiconductor device of claim 15, wherein the first barrier film does not overlap the second barrier film on the field insulating film in a thickness direction of the substrate.

18. A semiconductor device comprising:
a substrate including a first region and a second region;
a first active pattern disposed on the first region of the substrate, the first active pattern including a first lower pattern protruding from the substrate in a thickness direction of the substrate, and a plurality of first sheet patterns disposed on the first lower pattern and spaced apart from the first lower pattern in the thickness direction of the substrate;
a first gate insulating film disposed on the first active pattern and extending along the first active pattern;
a first work function adjustment pattern disposed on the first gate insulating film and extending along the first gate insulating film;
a first gate electrode disposed on the first work function adjustment pattern;
a second active pattern disposed on the second region of the substrate, the second active pattern including a second lower pattern protruding from the substrate in the thickness direction of the substrate, and a plurality of second sheet patterns disposed on the second lower pattern and spaced apart from the second lower pattern in the thickness direction of the substrate;
a second gate insulating film disposed on the second active pattern and extending along the second active pattern;

a second work function adjustment pattern disposed on the second gate insulating film and extending along the second gate insulating film; and a second gate electrode disposed on the second work function adjustment pattern, wherein the first work function adjustment pattern includes a first work function adjustment film, a second work function adjustment film that includes aluminum and wraps the first work function adjustment film, and a first barrier film including titanium silicon nitride (TiSiN), the second work function adjustment pattern includes a third work function adjustment film, a fourth work function adjustment film that includes aluminum and wraps the third work function adjustment film, and a second barrier film including titanium silicon nitride (TiSiN), a thickness of the second work function adjustment film is greater than a thickness of the first work function adjustment film and a thickness of the first barrier film, and a thickness of the fourth work function adjustment film is greater than a thickness of the third work function adjustment film and a thickness of the second barrier film.

19. The semiconductor device of claim 18, wherein:

the first work function adjustment film and the third work function adjustment film include titanium nitride (TiN); and the second work function adjustment film and the fourth work function adjustment film include titanium aluminum carbide (TlAlC).

20. The semiconductor device of claim 18, wherein a concentration of silicon of the first barrier film and a concentration of silicon of the second barrier film are in a range of about 30 at % or less.

* * * * *